(12) United States Patent
Fujima

(10) Patent No.: US 7,075,835 B2
(45) Date of Patent: Jul. 11, 2006

(54) REDUNDANCY CONTROL CIRCUIT WHICH SURELY PROGRAMS PROGRAM ELEMENTS AND SEMICONDUCTOR MEMORY USING THE SAME

(75) Inventor: Shiro Fujima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/809,044

(22) Filed: Mar. 25, 2004

(65) Prior Publication Data

US 2004/0213056 A1 Oct. 28, 2004

(30) Foreign Application Priority Data

Mar. 31, 2003 (JP) ............................. 2003-096353

(51) Int. Cl.
*G11C 7/00* (2006.01)
(52) U.S. Cl. ...................... 365/200; 365/96; 365/225.7
(58) Field of Classification Search ............. 365/225.7, 365/200, 96; 327/525, 526
See application file for complete search history.

(56) References Cited

U.S. PATENT DOCUMENTS

| 5,896,041 | A | | 4/1999 | Sher et al. |
| 6,115,283 | A | * | 9/2000 | Hidaka ........................ 365/149 |
| 6,150,868 | A | | 11/2000 | Kim et al. |
| 6,163,488 | A | * | 12/2000 | Tanizaki et al. ............. 365/200 |
| 6,424,584 | B1 | * | 7/2002 | Seyyedy ................... 365/225.7 |
| 6,438,059 | B1 | * | 8/2002 | Akita et al. ............... 365/225.7 |

FOREIGN PATENT DOCUMENTS

| JP | 2000-90689 | 3/2000 |
| JP | 2000-511326 | 8/2000 |
| WO | WO97/45872 | 12/1997 |

* cited by examiner

*Primary Examiner*—Son Mai
(74) *Attorney, Agent, or Firm*—Katten Muchin Rosenman LLP

(57) ABSTRACT

A redundancy control circuit includes a plurality of program elements and a voltage control section. In the plurality of program elements, a defect address indicating a position of a defect is programmed by a dielectric breakdown due to applying of a voltage. The voltage control section applies the voltage to a part of a plurality of targeted program elements simultaneously. The plurality of targeted program elements is a part of the plurality of program element to be dielectrically broken down correspondingly to the defect address.

21 Claims, 17 Drawing Sheets

REDUNDANCY CONTROL CIRCUIT WHICH SURELY PROGRAMS PROGRAM ELEMENTS AND SEMICONDUCTOR MEMORY USING THE SAME

BACKGROUND OF THE INVENTION

1. Field of the Invention

The present invention relates to a redundancy control circuit and a semiconductor memory using the same.

2. Description of the Related Art

In a semiconductor memory having a conventional redundancy memory circuit, a setting of a defect address to substitute a redundancy memory cell for a defective primary cell is typically carried out by blowing a fuse, to program the redundancy memory cell to respond the address of the defective primary cell. In this case, the fuse is blown by executing a physical dielectric breakdown by means of an external laser, at a wafer step.

As mentioned above, a method which uses the laser and breaks down the fuse, must break down the fuse before sealing a memory chip into a package. For this reason, the defects induced after the memory chip is sealed into the package (assembled) can not be relieved. This results that the sufficient improvement of yield can not be attained.

A method is known that can relieve the defects after the assembling. The method uses a metal fuse, a poly-silicon fuse and an anti-fuse that can be programmed by applying a high voltage. As for the anti-fuse programming process, a high voltage is applied between an upper electrode and a lower electrode of the anti-fuse. Then, the insulating film between these electrodes is dielectrically broken down so that both of the electrodes are short-circuited (electrically conducted).

This relieving method enables the defect address to be written to the anti-fuse, even after the chip is sealed into the package. Thus, the defects induced after the chip is sealed into the package can be relieved, thereby improving the yield.

When the defect address is set, the high voltage applying for dielectrically breakdown to the anti-fuse may be supplied from outside the device. However, there is the limit that a terminal for supplying a high voltage must be mounted on the device and that the defects can not be relieved after a module is assembled.

Therefore, there is a method of using a high voltage generated by a high voltage generating circuit inside the device. However, since the high voltage generating circuit is installed inside the device, the configuration of a power source and a circuit is limited, and there is a limit on its supplying performance.

Conventionally, when a plurality of anti-fuses are dielectrically broken down correspondingly to the data of the defect address, the high voltage generated by that high voltage generating circuit is simultaneously applied to the plurality of anti-fuses. In this case, if one anti-fuse is dielectrically broken down early, that broken anti-fuse is in the electrically conductive state. This leads to drop the level of the voltage applied to other anti-fuses that are not still electrically broken down. Originally, because of the limit on the current supplying performance of the high voltage generating circuit, the much high voltage can not continue to be applied to the broken anti-fuse. Therefore, if the level of the voltage is made down by the fact that the one anti-fuse is dielectrically broken down early, the other anti-fuses may not be dielectrically broken down.

In conjunction with the above description, Japanese Laid Open Patent Application (JP-A 2000-511326A) discloses a method of programming an anti-fuse. The method of programming the anti-fuse includes: supplying a positive voltage to a first terminal of the anti-fuse and supplying a negative voltage to a second terminal, so that a voltage applied between the first terminal and the second terminal is larger than one of the positive voltage and the negative voltage. At least one of the positive voltage and the negative voltage may be generated by a method including: supplying a first voltage to a first late of a capacitor and a second voltage to a second plate of the capacitor, then changing the first voltage to a third voltage of the first plate of the capacitor and connecting the second plate of the capacitor to the anti-fuse.

Also, in conjunction with the above description, Japanese Laid Open Patent Application (JP-A 2000-90689A) discloses a programming circuit of an anti-fuse. The programming circuit is characterized by including: an actuation switch section which pre-charges with half supply voltage; an anti-fuse which is connected to the actuation switch and is dielectrically broken down when an overcurrent flows; a sense signal input section which receives a sensing signal for checking the condition that the anti-fuse is programmed; a breakdown-voltage supplying section which supplies a supply voltage for dielectric breakdown of the anti-fuse; an output section which outputs a programming condition of the anti-fuse in response to a signal of the sense signal input section; a current breaking section which are intermittent in a current pass through which a current is supplied to the anti-fuse from the breakdown-voltage supplying section in response to a control signal of the output section; and a latch section which supplies the stabilized half supply voltage to the anti-fuse terminal in response to a control signal of the output section.

SUMMARY OF THE INVENTION

Therefore, an object of the present invention is to provide a redundancy control circuit that can surely program a program element, and a semiconductor memory using the same.

Another object of the present invention is to provide a redundancy control circuit that can surely program a program element, even if the performance of a high voltage generating circuit is limited, and a semiconductor memory using the same.

Still another object of the present invention is to provide a redundancy control circuit that can improve reliability and a production yield, and a semiconductor memory using the same.

This and other objects, features and advantages of the present invention will be readily ascertained by referring to the following description and drawings.

In order to achieve an aspect of the present invention, the present invention provides a redundancy control circuit including: a plurality of program elements and a voltage control section. In the plurality of program elements, a defect address indicating a position of a defect is programmed by a dielectric breakdown due to applying of a voltage. The voltage control section applies the voltage to part of a plurality of targeted program elements simultaneously. The plurality of targeted program elements is part of the plurality of program element to be dielectrically broken down correspondingly to the defect address.

In the redundancy control circuit of the present invention, a number of the part of the plurality of targeted program elements, of which number is less than a number of the plurality of program elements, is one (1). The voltage control section applies the voltage to each of the plurality of targeted program elements, one by one.

In the redundancy control circuit of the present invention, the voltage control section applies the voltage to the plurality of targeted program elements, at a timing of a trigger signal.

In the redundancy control circuit of the present invention, the voltage control section commonly applies the voltage to the plurality of targeted program elements. The voltage is a voltage generated inside a device including the redundancy control circuit.

In the redundancy control circuit of the present invention, the voltage control section includes a timing setting section and a plurality of element breakdown sections. The timing setting section outputs a timing signal indicating a timing for carrying out a dielectric breakdown of each of the plurality of program elements based on a trigger signal. Each of the plurality of element breakdown sections is installed correspondingly to the each of the plurality of program elements and applies the voltage to corresponding one of the plurality of program elements based on the timing signal and the defect address.

In the redundancy control circuit of the present invention, each of the plurality of element breakdown sections includes a fuse breakdown setting section and a voltage applying section. The fuse breakdown setting section applies a specifying signal at a timing of the timing signal based on the defect address, wherein the specifying signal indicates whether or not the corresponding one of the plurality of program elements should be dielectrically broken down. The voltage applying section applies the voltage to the corresponding one of the plurality of program elements in responses to the specifying signal, when the specifying signal indicates that the corresponding one of the plurality of program elements should be dielectrically broken down.

In the redundancy control circuit of the present invention, a first timing is different from a second timing. The first timing is a timing when a first the fuse breakdown setting section for a first one of the plurality of program elements, outputs a first the specifying signal. The second timing is a timing when a second the fuse breakdown setting section for a second one of the plurality of program elements, outputs a second the specifying signal.

The redundancy control circuit of the present invention, further include a comparing section which compares the voltage with a standard voltage and outputs a comparing result signal. The timing setting section generates the second timing based on the trigger signal and the comparing result signal indicating that the voltage exceeds the standard voltage, after the voltage applying section supplies the voltage in responses to the first specifying signal supplied at the first timing.

In the redundancy control circuit of the present invention, the timing setting section includes a first counter, a second counter and a third counter. The first counter starts counting a first pulse number of the trigger signal when the first pulse number is M, and outputs a first control signal when counted the first pulse number is N. The second counter starts counting a second pulse number of the trigger signal when the second pulse number is (M+N), and outputs a second control signal when counted the second pulse number is N. The third counter starts counting a third pulse number of the trigger signal when the third pulse number is (M+2×N), and outputs a third control signal when counted the third pulse number is N. The first counter includes a first logical section which outputs a first the timing signal indicative of a timing when the first specifying signal is outputted, based on an inversion signal of the second control signal and the first control signal. The second counter includes a second logical section which outputs a second timing signal indicative of a timing when the second specifying signal is outputted, based on an inversion signal of the third control signal and the second control signal.

In the redundancy control circuit of the present invention, the program element is an anti-fuse.

In order to achieve another aspect of the present invention, the present invention provides a semiconductor memory, including a redundancy control circuit, one of a redundancy word line and a redundancy bit line and a plurality of redundancy memory cells. The redundancy control circuit includes a plurality of program elements and a voltage control section. In the plurality of program elements, a defect address indicating a position of a defect is programmed by a dielectric breakdown due to applying of a voltage. The voltage control section applies the voltage to part of a plurality of targeted program elements simultaneously. The plurality of targeted program elements is part of the plurality of program element to be dielectrically broken down correspondingly to the defect address, one of a redundancy word line and a redundancy bit line is replaced from one of a defective word line and a defective bit line corresponding to the defect address. The plurality of redundancy memory cells is connected to one of the redundancy word line and the redundancy bit line.

In the semiconductor memory of the present invention, a number of the part of the plurality of targeted program elements, of which number is less than a number of the plurality of program elements, is one (1). The voltage control section applies the voltage to each of the plurality of targeted program elements, one by one.

In the semiconductor memory of the present invention, the voltage control section applies the voltage to the plurality of targeted program elements, at a timing of a trigger signal.

In the semiconductor memory of the present invention, the voltage control section commonly applies the voltage to the plurality of targeted program elements. The voltage is a voltage generated inside a device including the redundancy control circuit.

In the semiconductor memory of the present invention, the voltage control section includes a timing setting section and a plurality of element breakdown sections. The timing setting section outputs a timing signal indicating a timing for carrying out a dielectric breakdown of each of the plurality of program elements based on a trigger signal. Each of the plurality of element breakdown sections is installed correspondingly to the each of the plurality of program elements and applies the voltage to corresponding one of the plurality of program elements based on the timing signal and the defect address.

In the semiconductor memory of the present invention, each of the plurality of element breakdown sections includes a fuse breakdown setting section and a voltage applying section. The fuse breakdown setting section applies a specifying signal at a timing of the timing signal based on the defect address. The specifying signal indicates whether or not the corresponding one of the plurality of program elements should be dielectrically broken down. The voltage applying section applies the voltage to the corresponding one of the plurality of program elements in responses to the specifying signal, when the specifying signal indicates that the corresponding one of the plurality of program elements should be dielectrically broken down.

In the semiconductor memory of the present invention, a first timing is different from a second timing. The first timing is a timing when a first the fuse breakdown setting section for a first one of the plurality of program elements, outputs a first the specifying signal. The second timing is a timing when a second the fuse breakdown setting section for a second one of the plurality of program elements, outputs a second the specifying signal.

The semiconductor memory of the present invention, further include a comparing section which compares the voltage with a standard voltage and outputs a comparing result signal. The timing setting section generates the second timing based on the trigger signal and the comparing result signal indicating that the voltage exceeds the standard voltage, after the voltage applying section supplies the voltage in responses to the first specifying signal supplied at the first timing.

In the semiconductor memory of the present invention, the timing setting section includes a first counter, a second counter and a third counter. The first counter starts counting a first pulse number of the trigger signal when the first pulse number is M, and outputs a first control signal when counted the first pulse number is N. The second counter starts counting a second pulse number of the trigger signal when the second pulse number is (M+N), and outputs a second control signal when counted the second pulse number is N. The third counter starts counting a third pulse number of the trigger signal when the third pulse number is (M+2×N), and outputs a third control signal when counted the third pulse number is N. The first counter includes a first logical section which outputs a first the timing signal indicative of a timing when the first specifying signal is outputted, based on an inversion signal of the second control signal and the first control signal. The second counter includes a second logical section which outputs a second timing signal indicative of a timing when the second specifying signal is outputted, based on an inversion signal of the third control signal and the second control signal.

In the semiconductor memory of the present invention, the program element is an anti-fuse.

In the semiconductor memory of the present invention, the semiconductor memory is DRAM. The program element has the same structure as a capacitor of a memory cell of the DRAM.

All of anti-fuses to be dielectrically broken down are not dielectrically broken down at the same time. Here, the anti-fuses include anti-fuses used for indicating the use of the redundancy circuit and anti-fuses used for indicating bits of a defect address. The number of the anti-fuses (for example, one (1)) dielectrically broken down (at the same time) is less than that of all of the anti-fuses to be dielectrically broken down. When the voltage is applied to one anti-fuse at a time, the high voltage is not simultaneously applied to the plurality of anti-fuses. Thus, a current leak source is never induced, and a desired high voltage can be surely applied to the targeted anti-fuse. The possibility of inducing of the current leak source becomes low, as compared with the case that the number of the anti-fuses, to which the high voltage is simultaneously applied, is equal to that of all of the anti-fuses to be dielectrically broken down.

When the high voltage is generated for performing the dielectric breakdown on the anti-fuse in the semiconductor device, the high voltage is sequentially applied to the anti-fuses, of which number is less than that to be dielectrically broken down corresponding to the defect address, so as to surely apply the high voltage to the anti-fuse even under the limited current supplying ability.

A shifter is placed for controlling the former stage of the voltage applying circuit in the portion to which the high voltage is applied. Then, the SVT (the high voltage for performing the dielectric breakdown of anti-fuse) is sequentially applied to the individual anti-fuses, either one anti-fuse at a time or more than one anti-fuse at a time, in synchronization with the external trigger signal CLK. Here, the number of the more than one anti-fuses is less than that of the address bits at a time. Consequently, it is possible to continue to apply the SVT until the dielectric breakdown of the targeted anti-fuse. Even if the current supplying performance of the SVT generator is limited, it is possible to surely perform the dielectric breakdown on the targeted anti-fuse. Since it is not simultaneously applied to the anti-fuses that number is plural or equal to the number of the address bits, the possibility of the occurrence of other current leak is little, or the possibility is zero. Thus, the SVT level can be surely applied to the anti-fuse.

DESCRIPTION OF THE PREFERRED EMBODIMENTS

Embodiments of a redundancy control circuit and a semiconductor memory using the same according to the present invention will be described below with reference to the attached drawings. Similar symbols are given to similar components, and their detailed explanations may be omitted.

In these embodiments, even if the performance of a high voltage generating circuit in a semiconductor device is limited to disable so much high voltage to be applied to program elements, the program elements can be surely programmed. It is because that the plurality of program elements is programmed one by one. The semiconductor device in these embodiments is a DRAM. A metal fuse, a poly-silicon fuse, an anti-fuse and the like may be used as the program elements. The anti-fuse will be exemplified below in these embodiments. Here, the configuration of the anti-fuse is the same as that of the capacitor of the DRAM memory cell.

The First Embodiment

A first embodiment will be described below with reference to FIGS. 1 to 11.

Figure 1:
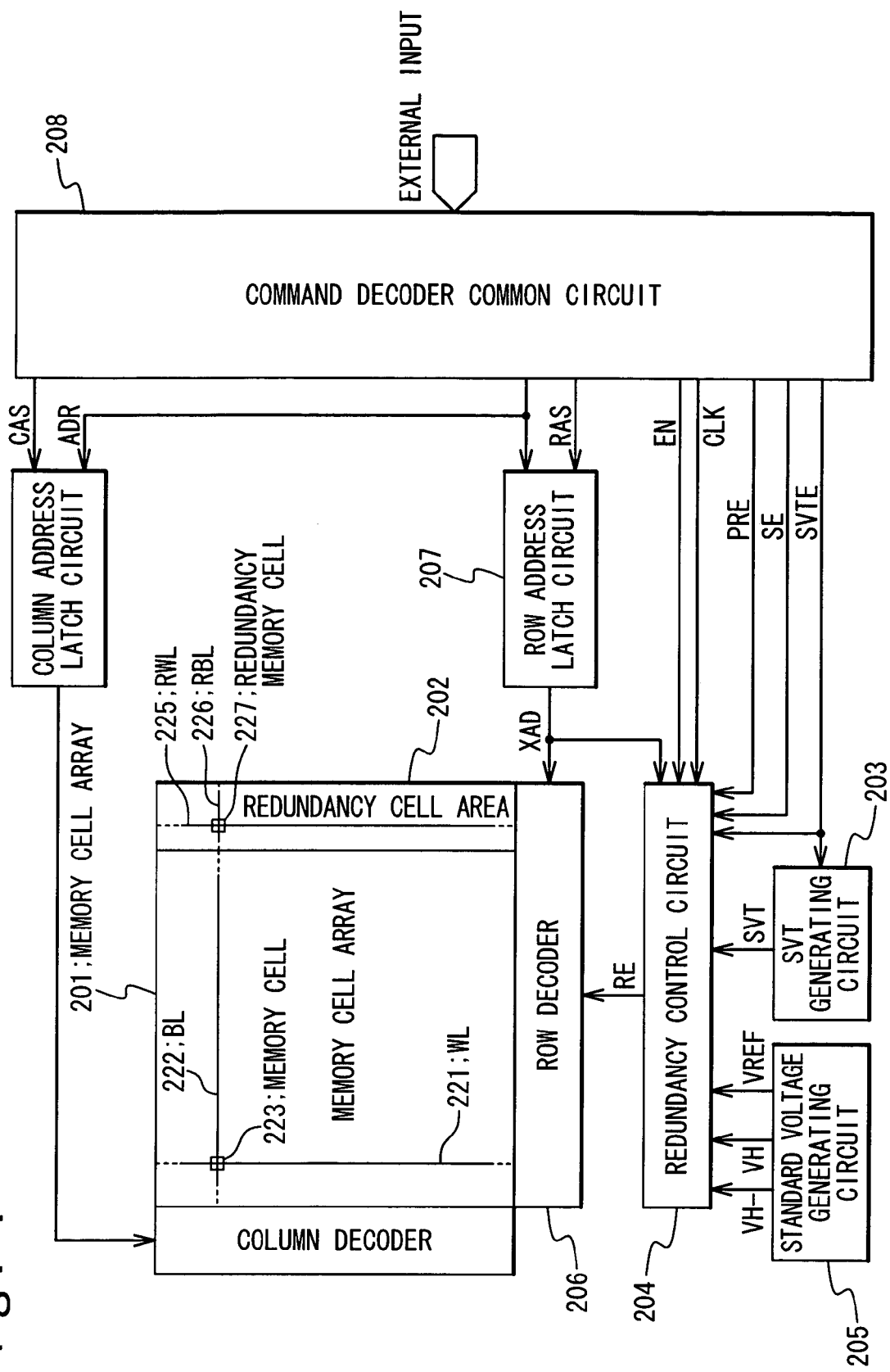
FIG. 1 is a block diagram showing a first embodiment of the DRAM according to the present invention.

FIG. 1 is a block diagram showing a first embodiment of the DRAM (the semiconductor memory including the redundancy control circuit) according to the present invention. For simplifying the explanation, only configurations related to a row side are illustrated in FIG. 1, and configurations related to a column side are omitted. The DRAM having a redundancy memory circuit includes a memory cell array 201, a row decoder 206, a row address latch circuit 207 and a command decoder common circuit 208. A spare memory cell array is also included in the DRAM in order to relieve a defective bit in the memory cell array 201 and improve the yield. The memory cell array 201 includes a plurality of word lines WL221, a plurality of bit lines BL222 and a plurality of memory cells 223. The spare memory cell array is provided with a redundancy cell area 202 and a redundancy control circuit 204. The redundancy cell area 202 includes a plurality of word lines RWL225, a plurality of bit lines RBL226 (in some cases, they are same as BL222) and a plurality of redundancy memory cells 227. A standard voltage generating circuit 205 and an SVT generating circuit 203 is also included in the DRAM to generate voltages and signals which are required to set the defect address for the redundancy control circuit 204.

As the usual operations including the reading and writing operations of a memory cell are well known, their explanations are omitted. Here, only items with regard to a fuse breakdown regarding a redundancy circuit will be described. The command decoder common circuit 208 interprets the command represented by a plurality of signals supplied from outside through a plurality of signal lines, and determines the operations. Then, it generates the signals necessary for the operations including a row address selection control signal RAS, a preparation signal PRE and a redundancy enable signal EN. A trigger signal is used for setting the defect address in the redundancy control circuit 204. The trigger signal is supplied from a terminal for receiving a clock signal at the time of the usual operations. The trigger signal is supplied to respective sections as a timing signal CLK. Here, the trigger signal (timing signal) is supplied from an external testing apparatus or the like, in order to sequentially perform the dielectric breakdown on the anti-fuses 100. Also, it is available to use a signal generated in the DRAM as the timing signal CLK.

The row address latch circuit 207 stores (holds) an address signal ADR supplied from the outside as a row address, on the basis of the row address selection control signal RAS. The row address selection control signal RAS indicates that the row address is effective. The stored row address is sent to the redundancy control circuit 204 and the row decoder 206 as an address signal XAD. Incidentally, if it is necessary to distinguish respective bits of the address signal XAD, the bits (n bits) are referred to as address signals X1 to Xn.

The redundancy control circuit 204 has a function of programming the address XAD as the defect address to the anti-fuses included in the redundancy control circuit 204, in a fuse breakdown sequence. Also, the redundancy control circuit 204 sets the defect address for the latch circuit for initialization in a fuse initializing sequence. Here, the defect address indicates the position of a programmed defect bit. The redundancy control circuit 204 generates the redundancy selection signal RE and gives it to the row decoder 206, when receiving the address signal XAD and a redundancy enable signal EN, in a redundancy selection sequence that is the usual operation. Here, the redundancy selection signal RE indicates whether or not the redundancy cell area 202 is selected. Also, the redundancy enable signal EN indicates the access to the memory cell.

The row decoder 206 specifies a cell accessed in the memory cell array 201 or the redundancy cell area 202, in accordance with the address signal XAD and the redundancy selection signal RE.

Figure 7:
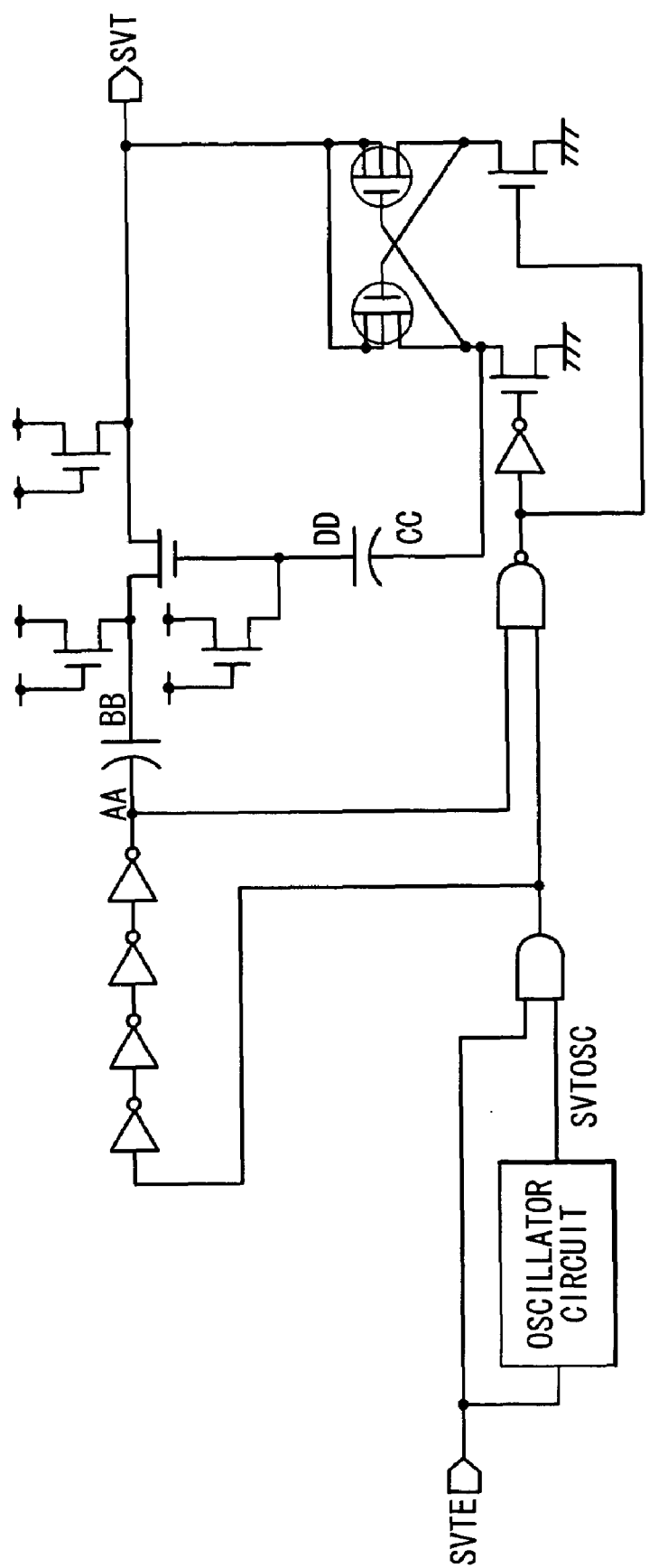
FIG. 7 is a block diagram showing the configuration of the SVT generating circuit of the first embodiment.

The SVT generating circuit 203 boosts up a power source voltage in the semiconductor device to generate a high voltage SVT for performing the dielectric breakdown on the insulating film of the anti-fuse corresponding to the defect address. Then, the SVT generating circuit 203 supplies it to the redundancy control circuit 204. FIG. 7 is a block diagram showing the SVT generating circuit 203. The SVT generating circuit 203 is configured as the boosting circuit using a conventional charging pump. Thus, its detailed explanation is omitted.

The standard voltage generating circuit 205 generates standard signals VH, VH– and supplies them to the redundancy control circuit 204. The standard signals VH, VH– indicate the standard voltages as the standards in judging whether or not the insulating film of the anti-fuse is dielectrically broken down.

Figure 2:
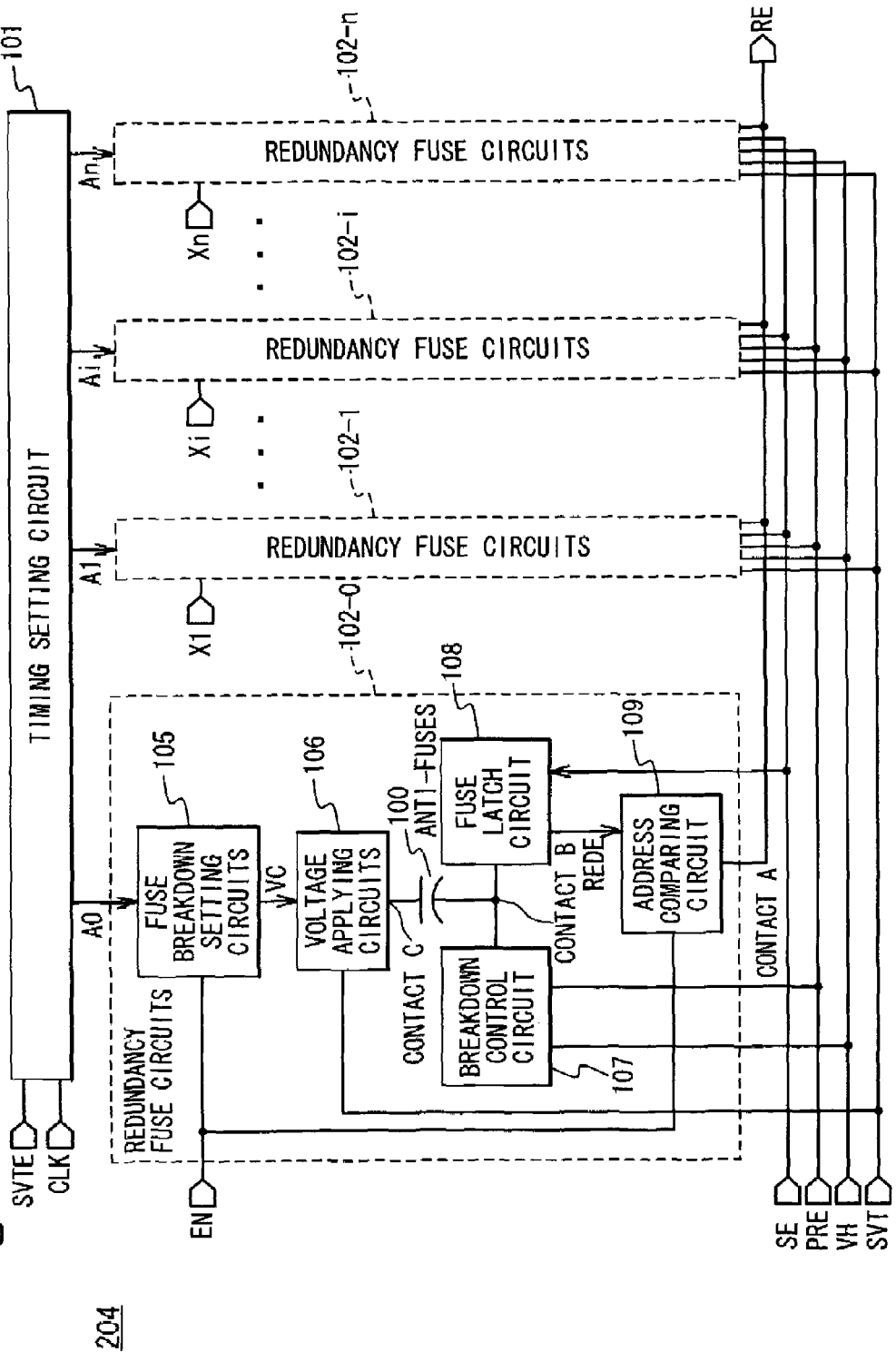
FIG. 2 is a view showing the configuration of a part of the redundancy control circuit of the first embodiment.

FIG. 2 is a view showing the configuration of a part of the redundancy control circuit 204, which is used for one line of a redundancy memory cell array. The redundancy enable signal EN is a signal indicating whether or not that redundancy fuse circuit (102-0) is used. The function of the redundancy enable signal EN is similar to that of the other address signals X1 to Xn. Therefore, if there is no need to distinguish the redundancy enable signal EN and the address signals X1 to Xn particularly in the following explanation, these signals are merely represented by the address signal XAD including the redundancy enable signal EN. Also, the address data indicated by the address signal XAD is represented by an address XAD. One line of the redundancy memory cell array includes the plurality (n+1) of fuses corresponding to the address signals X1 to Xn and the signal EN indicative of the usage of the redundancy fuse circuit. In case of m lines of the redundancy memory cell array, it becomes m times that of the above-mentioned values. However, it is obvious that the operation of the m-th line is similar to that of one line, which is basic.

The redundancy control circuit 204 includes the plurality of redundancy fuse circuits 102-0 to 102-$n$ and a timing setting circuit 101. The plurality of redundancy fuse circuits 102-0 to 102-$n$ is placed respectively corresponding to the respective bits of the address signals XAD, breaks down the built-in anti-fuses 100, and detect the breakdown/non-breakdown of the anti-fuses 100. The address signals XAD is supplied from the row address latch circuit 207. The timing setting circuit 101 generates the timing signals for the anti-fuse breakdowns, and supplies them to corresponding one of the redundancy fuse circuits 102-0 to 102-$n$. The timing setting circuit 101 and the plurality of redundancy fuse circuits 102-0 to 102-$n$ except the built-in anti-fuses 100, has a function of a voltage control section. The voltage control section applies simultaneously the high voltage SVT to part of all of the built-in anti-fuses 100 to be break down.

The redundancy fuse circuits 102-$i$ (i=0 to n, integer) includes an anti-fuse 100-$i$, a breakdown control circuit 107-$i$, a fuse latch circuit 108-$i$, an address comparing circuit 109-$i$, an voltage applying circuits 106-$i$, and fuse breakdown setting circuits 105-$i$. The respective redundancy fuse circuits have the same configuration, except for the input signals such as addresses XAD and the inputs A0 to An from the timing setting circuit 101. If it names generically (such as "105", not "105-$i$"), their subscripts (-$i$) are omitted.

The fuse breakdown setting circuit 105 receives one bit of the address signal XAD. Then, if the bit is at a High level, it judges that the dielectric breakdown should be performed on the corresponding anti-fuse 100. When the dielectric breakdown should be performed on the anti-fuse 100, it activates a breakdown setting signal VC outputted to the voltage applying circuit 106 at the timing given by the timing setting circuit 101.

The voltage applying circuit 106 programs the anti-fuse 100 by adding the high voltage SVT to the anti-fuse 100 (contact C), in response to the breakdown setting signal VC received from the fuse breakdown setting circuit 105.

The high voltage SVT is generated by the SVT generating circuit 203 (shown in FIG. 1), and is given to the voltage applying circuit 106. As shown in FIG. 2, the high voltage SVT supplied to redundancy fuse circuits 102-$i$ is common to that of other redundancy fuse circuit 102-$j$ (j=0 to n, integer, j is not equal to i).

The breakdown control circuit 107 applies the standard voltage VH to the anti-fuse 100 (contact B) at the timing when the preparation signal PRE is activated, in order to judge the breakdown/non-breakdown of the anti-fuse 100. If the preparation signal PRE is inactive, the anti-fuse 100 (contact C) is assumed to be a ground potential, and it prepares for the programming of the anti-fuse 100.

The fuse latch circuit 108 samples and holds (stores) the state of the breakdown/non-breakdown of the anti-fuse 100 at a timing of a sampling signal SE. The data of the held (stored) breakdown/non-breakdown state is outputted as a judgment result signal REDE. The judgment result signal REDE becomes active if the anti-fuse 100 is at the breakdown state. The potential of the anti-fuse 100 (contact B) charged by the breakdown control circuit 107 is changed. Therefore, the state of the breakdown/non-breakdown of the anti-fuse 100 can be judged by comparing the potential of the anti-fuse 100 (contact B) with the standard voltage VH−.

The address comparing circuit 109 compares one of the address signals XAD (EN and X1 to Xn) with the judgment result signal REDE supplied from the fuse latch circuit 108. The address comparing circuit 109 outputs the compared result to a contact A. The respective address comparing circuits 109-0 to 109-$n$ outputs the respective compared results to the contact A. The contact A constitutes a wired AND circuit, and generates a redundancy selection signal RE. The redundancy selection signal RE is the signal which becomes active if all bits of the address signal XAD coincide with the states of the corresponding anti-fuses, and becomes inactive if at least one of the bits does not coincide.

Figure 3:
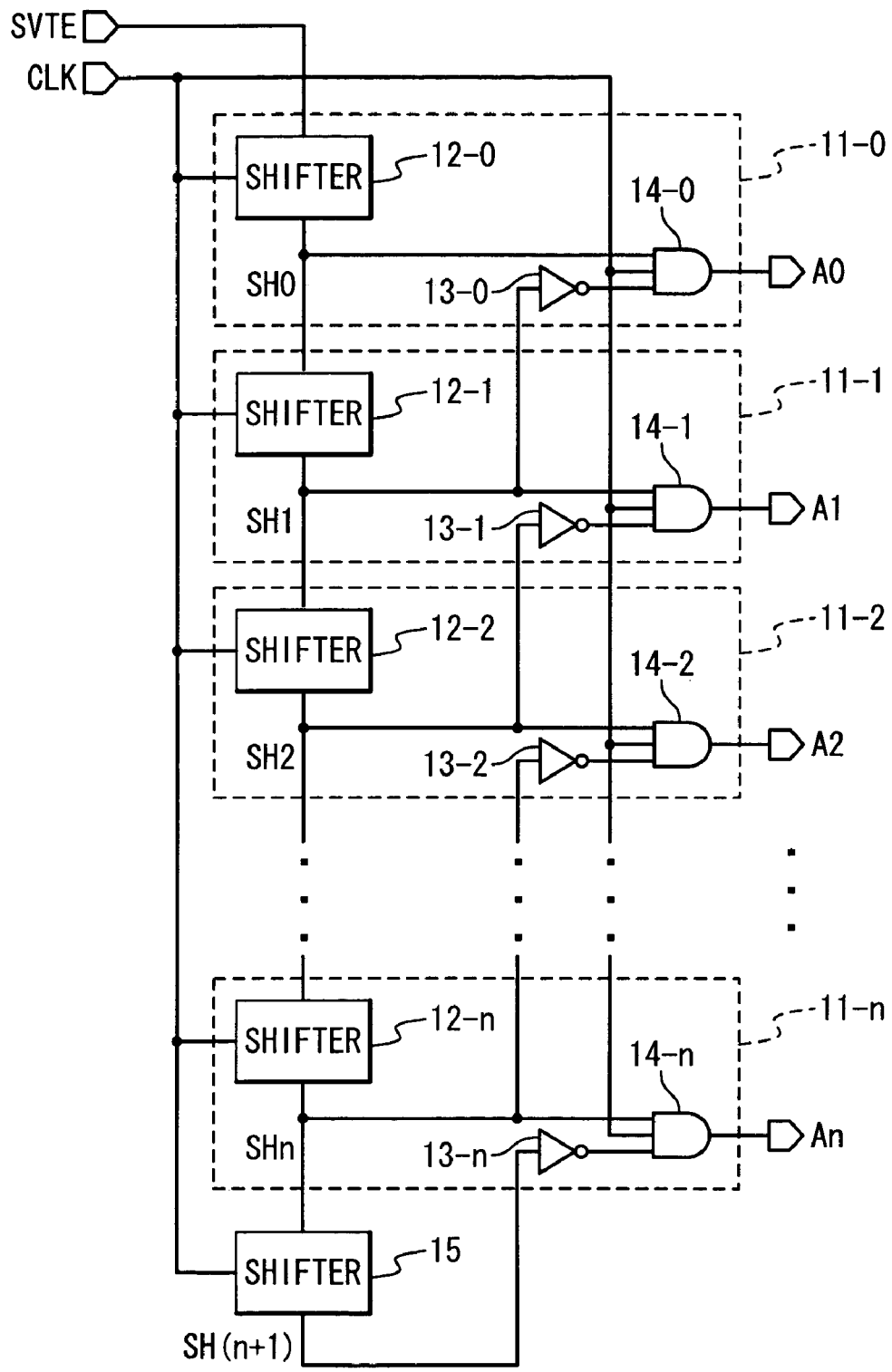
FIG. 3 is a block diagram showing the configuration of the timing setting circuit of the first embodiment.

The configuration of the timing setting circuit 101 will be described below with reference to FIG. 3. FIG. 3 is a block diagram showing the configuration of the timing setting circuit 101. The timing setting circuit 101 is the circuit for generating and outputting breakdown timing signals A0 to An in response to a received signal SVTE and a received timing signal CLK. The breakdown timing signals A0 to An indicates the timings when the anti-fuses 100 are broken down. The signal SVTE indicates a fuse breakdown sequence. The timing setting circuit 101 includes timing circuits 11-0 to 11-$n$ and a shifter 15. The timing circuit 11-$i$ (i=0 to n, integer, as mentioned above) includes a shifter 12-$i$, an AND circuit 14-$i$, and an inverter 13-$i$. A set of the shifter 12, the AND circuit 14 and the inverter 13 carries out the operation of the timing circuit 11 which corresponds to one stage. In the timing setting circuit 101, there are the operations corresponding to (n+1) stages. Also, the shifter 15 generates a signal given to a timing circuit 11-$n$ (a former stage circuit) and terminates the timing setting circuit 101. However, the shifter 15 may not be especially installed in the timing setting circuit 101 in case that the timing signal CLK is controlled not to be supplied in excess of the necessary number of its pulses. The redundancy cell area 202 has a plurality of row lines. If the timing setting circuits 101 corresponding to the other row lines of the redundancy cell area 202 are connected in series, a signal to be given to the former stage circuit from the connected next timing setting circuit 101 is received. Thus, it is enough to install one shifter 15 at that final stage. The shifters 12-0 to 12-$n$ and the shifter 15 count the number of the pulses of the clock (timing signal CLK) in the shifting operation for outputting the supplied signal in synchronization with the clock.

The timing circuit 11-0 at the first stage uses the signal SVTE as an input, carries out the shifting operation based on the timing signal CLK, outputs an output signal SH0 to a next stage (the timing circuit 11-1) and the AND circuit 14-0. Here, the signal SVTE indicates the fuse breakdown sequence. The inverter 13-0 gives a signal to the AND circuit 14-0. The signal is activated if an output signal SH1 of the shifter 12-1 is inactive. The AND circuit 14-0 activates a breakdown timing signal A0, when all of the output signal SH0, the signal outputted from the inverter 13-0 and the timing signal CLK are active (at the High level). The timing circuits 11 on and after the second stage receive a former stage output signal SH instead of the signal SVTE, and similarly activate the breakdown timing signals A.

Figure 4:
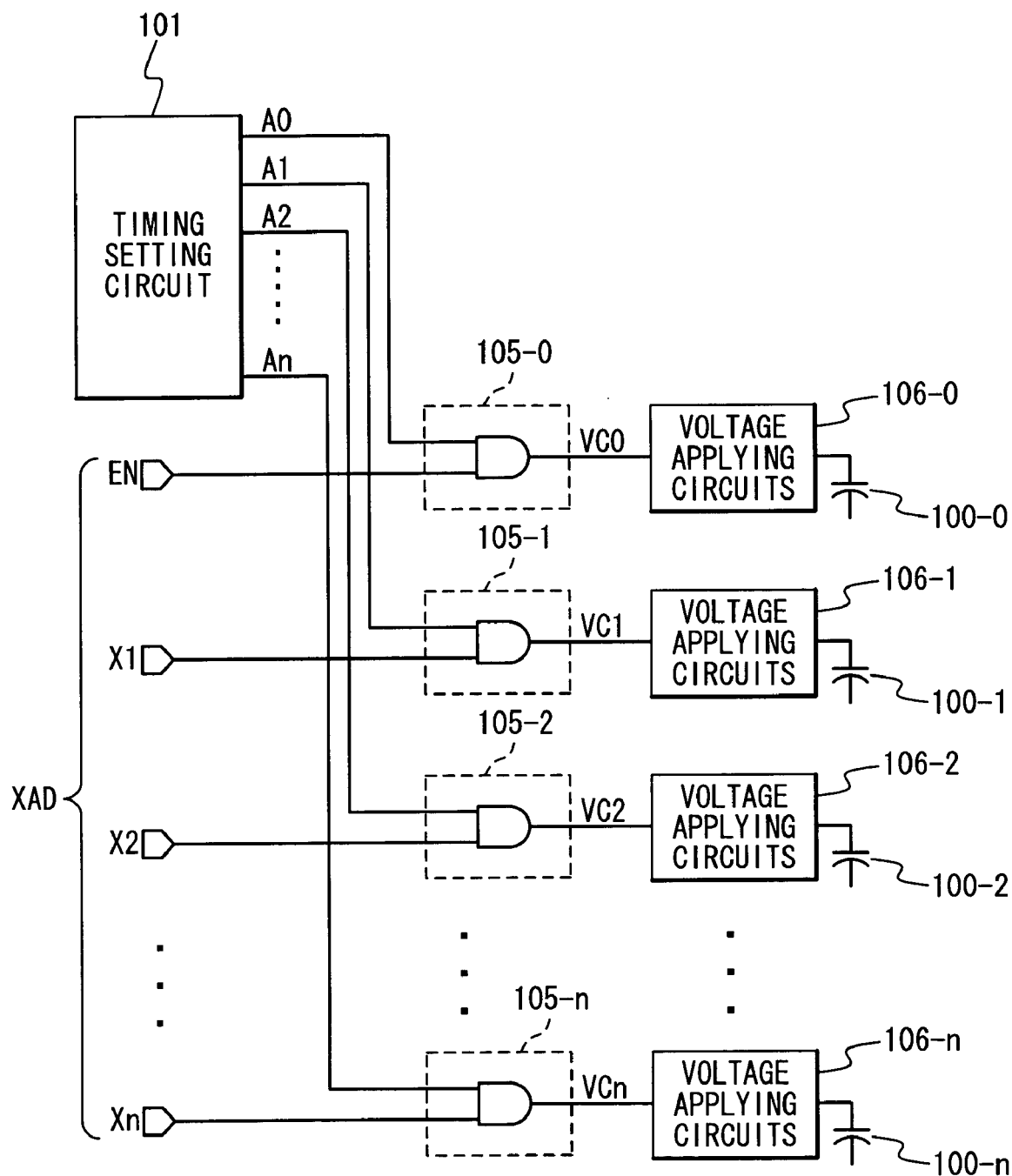
FIG. 4 is a block diagram showing the configuration of the fuse breakdown setting circuit and the related circuit of the first embodiment.

The configuration of the fuse breakdown setting circuit 105 and the related circuits will be described with reference to FIG. 4. FIG. 4 is a block diagram showing the configuration of the fuse breakdown setting circuit 105 and the related circuits. The fuse breakdown setting circuit 105 includes the AND circuit. The address signal XAD indicates whether or not its respective bits break down the anti-fuses 100, respectively. The breakdown timing signals A0 to An outputted by the timing setting circuit 101 indicate the timings to be broken down. Thus, if the anti-fuses 100 corresponding to the respective bits should be broken down, the fuse setting circuit 105 activates the breakdown setting signals VC at the timings corresponding to their bits.

Figure 5:
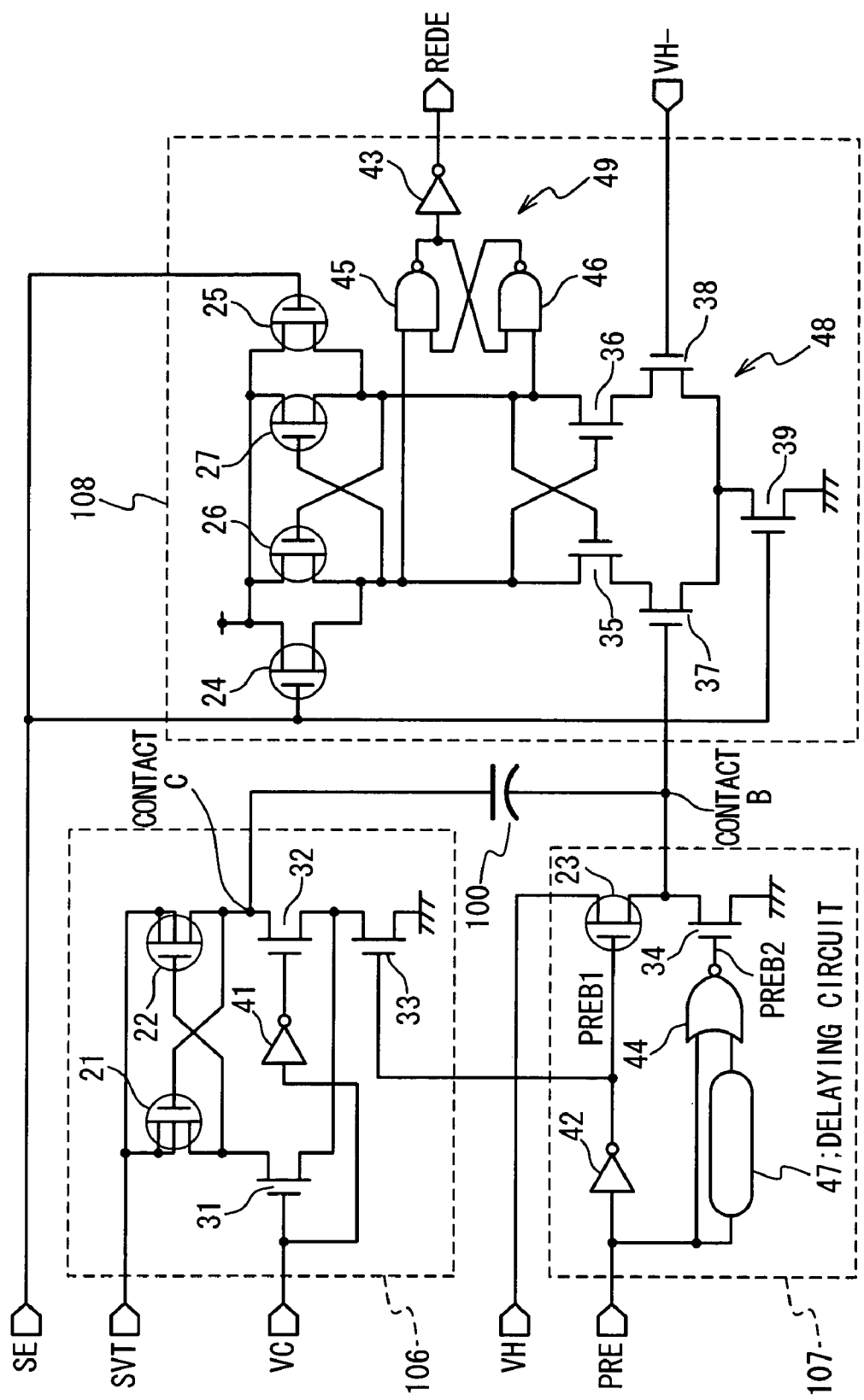
FIG. 5 is a block diagram showing the configuration of the voltage applying circuit, the breakdown control circuit and the fuse latch circuit of the first embodiment.

FIG. 5 is a block diagram showing the configuration of the voltage applying circuit. 106, the breakdown control circuit 107 and the fuse latch circuit 108.

The configuration of the voltage applying circuit 106 will be described below with reference to FIG. 5. The voltage applying circuit 106 includes an inverter 41, n-channel transistors 31, 32 and 33 and p-channel transistors 21, 22. When the anti-fuse 100 is broken down, the preparation signal PRE is inactive. Thus, the potential of the contact C is the potential of the high voltage SVT when the breakdown setting signal VC is activated, and it is the ground potential when the breakdown setting signal VC is inactivated.

The p-channel transistors 21, 22 and the n-channel transistors 31, 32 serve as the switching circuit, which is controlled by the breakdown setting signal VC, for applying to the contact C the high voltage SVT to program the anti-fuse 100 or applying the ground potential. The inverter 41 supplies the inversion signal of the breakdown setting signal VC to a gate of the n-channel transistor 32. The breakdown setting signal VC is supplied to a gate of the n-channel transistor 31. Consequently, this causes the n-channel transistors 31, 32 to carry out the operation as a pair.

In the fuse breakdown sequence in which the voltage applying circuit 106 programs the anti-fuse 100, the preparation signal PRE is inactive, and the n-channel transistor 33 is ON. If the breakdown setting signal VC is at the High level, the n-channel transistor 31 becomes ON, and the n-channel transistor 32 becomes OFF. Thus, the p-channel transistor 21 becomes OFF, and the p-channel transistor 22 becomes ON. Hence, the high voltage SVT is applied to the contact C. If the breakdown setting signal VC is at the Low level, the n-channel transistor 31 becomes OFF, and the n-channel transistor 32 becomes ON. Thus, the p-channel transistor 21 becomes ON, and the p-channel transistor 22 becomes OFF. Hence, the contact C becomes at the ground level. In this way, the voltage applying circuit 106 is the circuit for applying the high voltage SVT to the anti-fuse 100 at the timing controlled by the input breakdown setting signal VC.

The configuration of the breakdown control circuit 107 will be described below with reference to FIG. 5.

The breakdown control circuit 107 includes an inverter 42, a NOR circuit 44, an n-channel transistor 34, a p-channel transistor 23 and a delaying circuit 47. The preparation signal PRE and its delayed signal outputted by the delaying circuit 47 are supplied to the NOR circuit 44. Based on these signals, the NOR circuit 44 supply the inversion signal PREB2 to a gate of the n-channel transistor 34 in order to turns the n-channel transistor 34 OFF. In the inversion signal 34, the pulse width of the preparation signal PRE is enlarged correspondingly to its delayed value. The n-channel transistor 34 carries out the action such that if it is ON, the potential of the contact B is at the ground level, and if it is OFF, the potential of the contact B is given as the potential of a drain of the p-channel transistor 23.

The p-channel transistor 23 receives the signal PREB1 at a gate. The signal PREB1 is a signal that the preparation signal PRE is inverted by the inverter 42. While the preparation signal PRE is active, the standard voltage VH supplied to a source is outputted to a drain, and the contact B is set at the potential VH.

The configuration of the fuse latch circuit 108 will be described below with reference to FIG. 5.

The fuses latch circuit 108 includes a latch circuit 49, an inverter 43, p-channel transistors 24, 25, 26 and 27, and n-channel transistors 35, 36, 37, 38 and 39. The latch circuit 49 is composed of NAND circuits 45, 46. A sense amplifier 48 is composed of the p-channel transistors 26, 27 and the n-channel transistors 35, 36, 37 and 38. The sense amplifier 48 has a differential input and compares the potential of the contact B with the standard voltage VH−. The p-channel transistors 24, 25 and the n-channel transistor 39, which are controlled by a sampling signal SE, control the operation of the fuse latch circuit 108.

When the sampling signal SE is activated, the n-channel transistor 39 becomes ON, and the p-channel transistors 24, 25 become OFF, thereby activating the operation of the sense amplifier 48. When the sampling signal SE is deactivated, the n-channel transistor 39 becomes OFF, and the p-channel transistors 24, 25 become ON, thereby stopping the operation of the sense amplifier 48. Thus, two inputs of the latch circuit 49 become both at the High level and the latch circuit 49 functions so as to hold the detection state. The inverter 43 inverts the output of the latch circuit 49 into the judgment result signal REDE. In this way, the fuse latch circuit 108 is the circuit for holding the state of the breakdown/non-breakdown by measuring the potential of the contact B of the anti-fuse 100 at the timing of the sampling signal SE.

The configuration of the address comparing circuit 109 will be described below with reference to FIG. 6.

Figure 6:
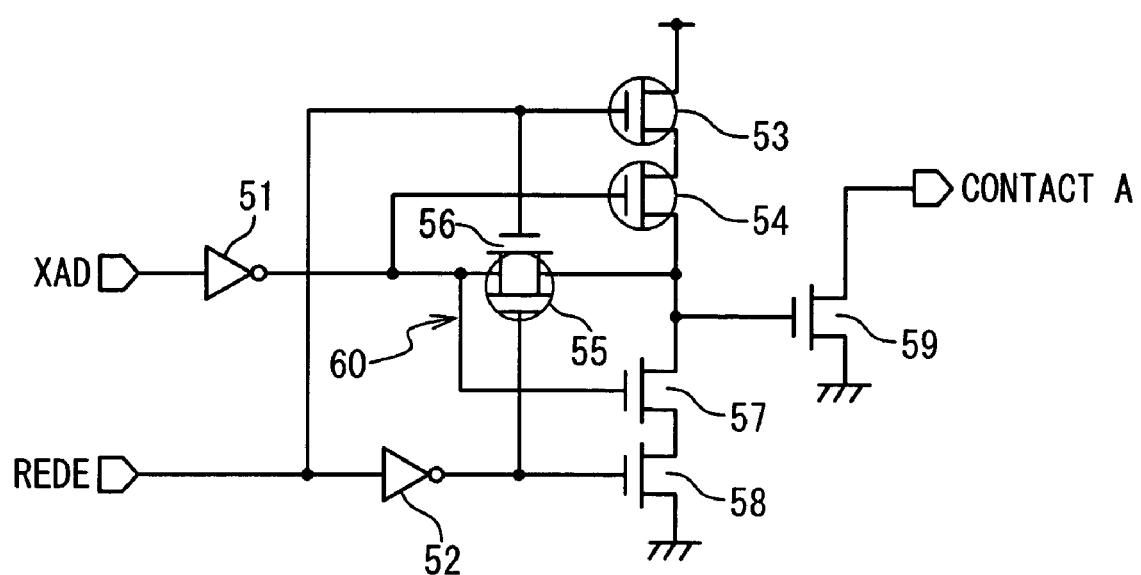
FIG. 6 is a block diagram showing the configuration of the address comparing circuit of the first embodiment.

FIG. 6 is a block diagram showing the configuration of the address comparing circuit 109. The address comparing circuit 109 includes inverters 51, 52, n-channel transistors 56, 57, 58 and 59 and p-channel transistors 53, 54 and 55. A switching circuit 60 is composed of the n-channel transistor 56 and the p-channel transistor 55. The switching circuit 60 becomes ON when the judgment result signal REDE is activated, and becomes OFF when the judgment result signal REDE is inactivated.

The address signal XAD is supplied to the inverter 51. The inverted signal outputted from the inverter 51 is supplied to the switching circuit 60 and gates of the n-channel transistor 57 and the p-channel transistor 54. The output of the switching circuit 60 is connected to drains of the n-channel transistor 57 and the p-channel transistor 54 and connected to a gate of the n-channel transistor 59. A drain of the n-channel transistor 59 is connected to the contact A as the output of the address comparing circuit 109, and a source is grounded. The judgment result signal REDE is supplied to the inverter 52, a gate of the p-channel transistor 53 and a gate of the n-channel transistor 56 of the switching circuit 60. Also, the inverted signal of the judgment result signal REDE that is the output of the inverter 52 is supplied to a gate of the p-channel transistor 55 of the switching circuit 60 and a gate of the n-channel transistor 58. A source of the p-channel transistor 53 is connected to the power source and a drain is connected to a source of the p-channel transistor 54. A source of the n-channel transistor 58 is grounded, and a drain is connected to a source of the n-channel transistor 57.

There are two operations in the address comparing circuit 109, depending on the activation state of the judgment result signal REDE. If the judgment result signal REDE is at the High level, namely, if the anti-fuse 100 is broken down, the switching circuit 60 becomes ON, and the p-channel transistor 53 and the n-channel transistor 58 become OFF. In this case, the switching circuit 60 sends the state of the output of the inverter 51 to the gate of the n-channel transistor 59. If the address signal XAD is at the High level, the gate of the n-channel transistor 59 becomes at the Low level. If the address signal XAD is at the Low level, the gate of the n-channel transistor 59 becomes at the High level. Since the n-channel transistor 59 acts as the inverter, the output of the address comparing circuit 109 is the inversion of the voltage level of the gate of the n-channel transistor 59. Then, the signal having the same level as the address signal XAD appears. In short, if the judgment result signal REDE and the address signal XAD have the same phase and both are at the High level, the output of the address comparing circuit 109 becomes at the High level, and in case of the opposite phase, it becomes at the Low level.

If the judgment result signal REDE is at the Low level, namely, if the anti-fuse 100 is not broken down, the switching circuit 60 becomes OFF, and both of the p-channel transistor 53 and the n-channel transistor 58 become ON. In this case, the voltage level of the gate of the n-channel transistor 59 is determined on the basis of the states of the p-channel transistor 54 and the n-channel transistor 59. The address signal XAD is inverted by the inverter 51 and supplied to the gates of the p-channel transistor 54 and the n-channel transistor 57.

If the address signal XAD is at the Low level, the output of the inverter 51 becomes at the High level, and the n-channel transistor 57 becomes ON, and the p-channel transistor 54 becomes OFF. Thus, the gate of the n-channel transistor 59 becomes at the Low level. If the address signal XAD is at the High level, the output of the inverter 51 becomes at the Low level, and the p-channel transistor 54 becomes ON, and the n-channel transistor 57 becomes OFF. Thus, the gate of the n-channel transistor 59 becomes at the High level. Since the n-channel transistor 59 acts as the inverter, the output of the address comparing circuit 109 becomes the inversion of the voltage level of the gate of the n-channel transistor 59. Then, the signal of the level in which the address signal XAD is inverted appears. In short, if the judgment result signal REDE and the address signal X have the same phase and both are at the Low level, the output of the address comparing circuit 109 becomes at the High level, and in case of the opposite phase, it becomes at the Low level.

Thus, with regard to the output of the address comparing circuit 109, if the address signal XAD and the judgment result signal REDE have the same phase, the signal of the High level is outputted. If the address signal XAD has the opposite phase of the judgment result signal REDE, the signal of the Low level is outputted. Only when all of the address comparing circuits 109 of the redundancy control circuit 204 output the outputs of the High level, the contact A becomes at the High level. Hence, the fact that the contact A is at the High level indicates that the address held by the fuse latch circuit 108 is coincident with the address indicated by the input address signal XAD. At this time, the redundancy selection signal RE is activated.

In this way, if the input address signal XAD and the data latched by the fuse latch circuit 108 are all respectively coincident, the input address signal XAD is the defect address. If it is judged as the defect address, the row decoder 206 disables the defective memory cell in the memory cell array 201 to be selected, and selects the cell of the redundancy cell area 202 (redundancy operation).

Figure 8:
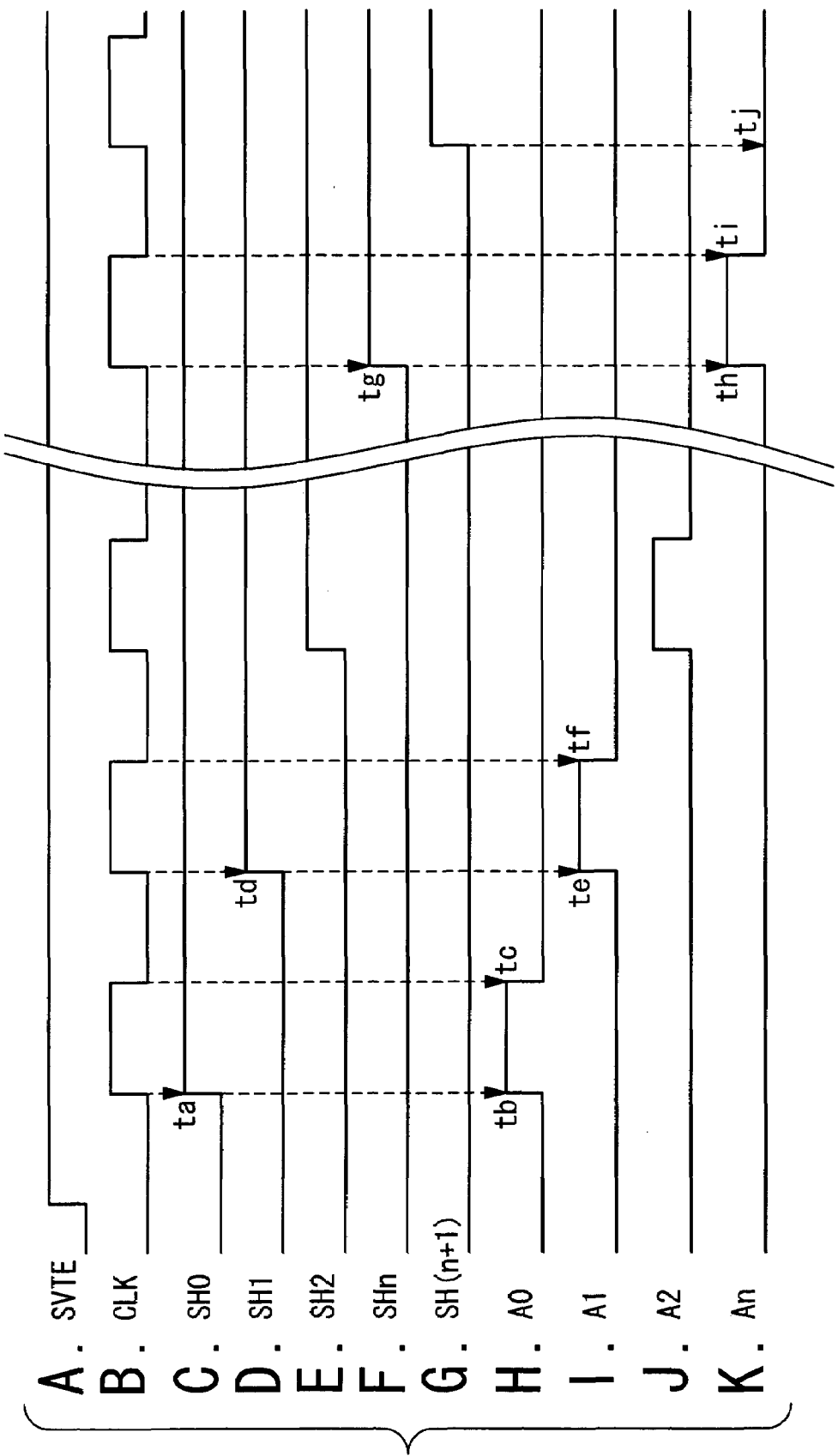
FIGS. 8A to 8K are timing charts showing the operation of the timing setting circuit of the first embodiment.
Figure 9:
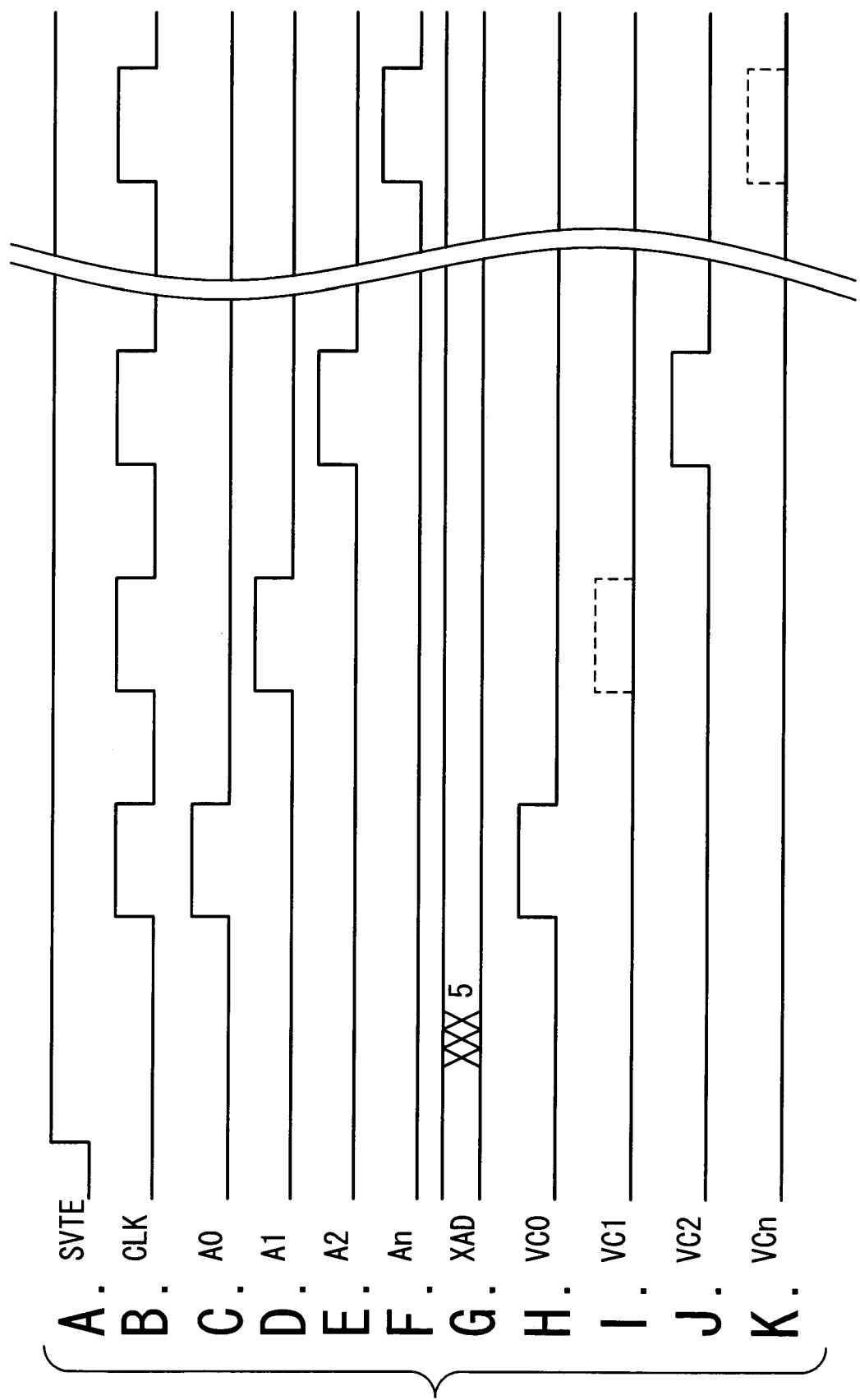
FIGS. 9A to 9K are timing charts showing the operation of the fuse breakdown sequence of the first embodiment.
Figure 10:
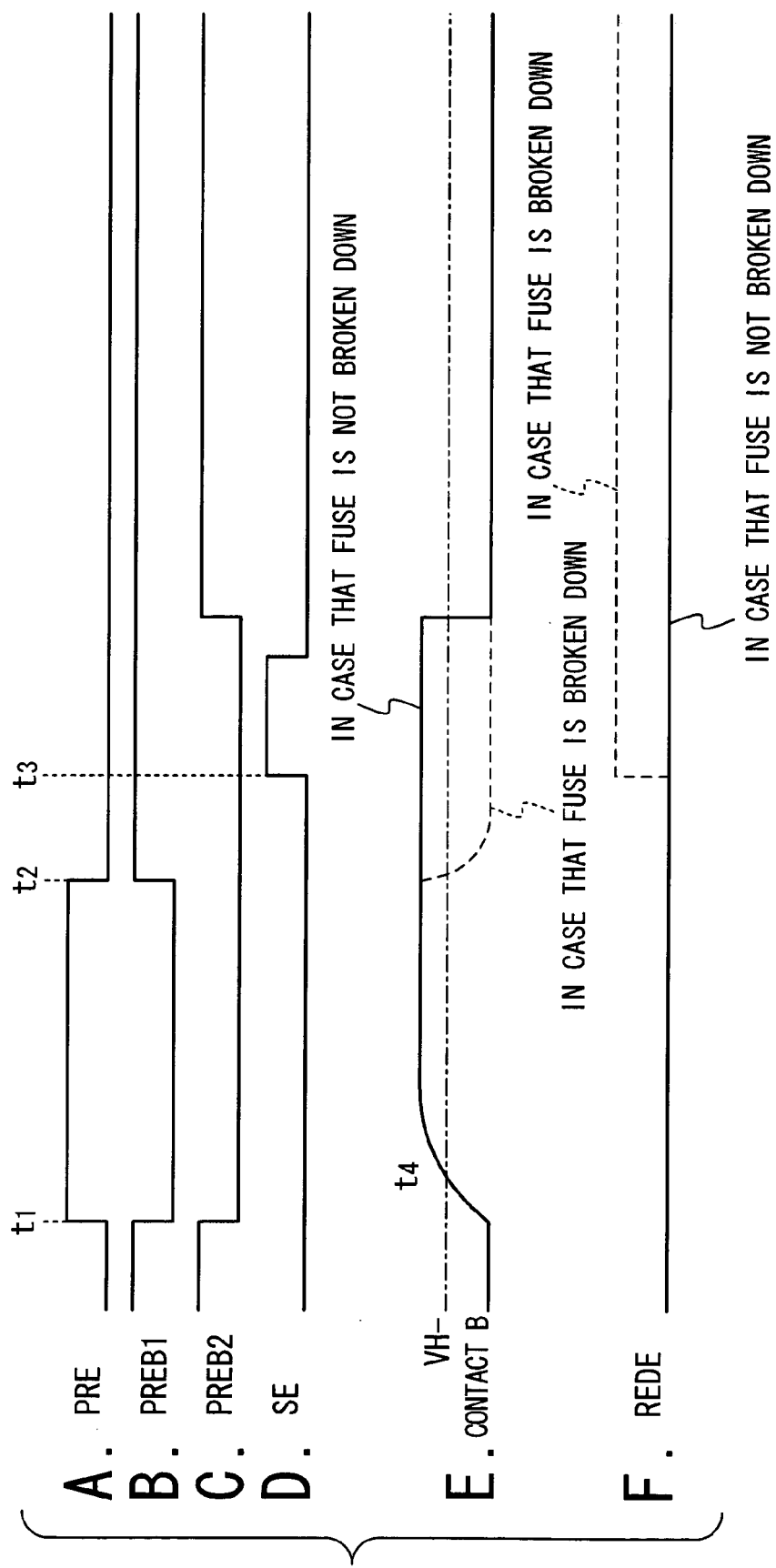
FIGS. 10A to 10F are timing charts showing the initializing operation of the first embodiment.
Figure 11:
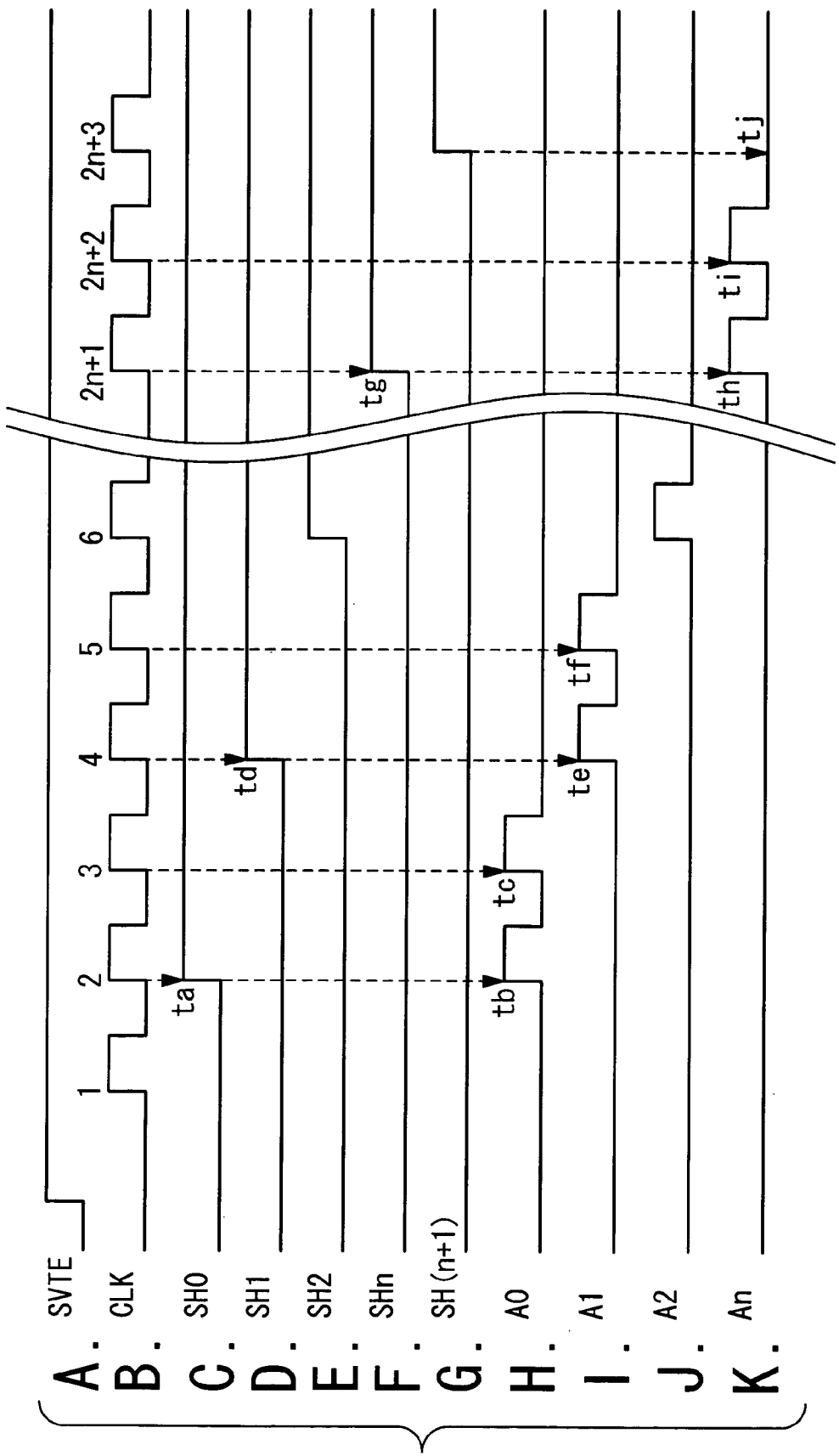
FIGS. 11A to 11K are timing charts showing a first variation of the first embodiment.

An operation of the redundancy control circuit 204 in this embodiment will be described below with reference to FIGS. 8 (8A to 8K) to 10 (10A to 10K).

FIGS. 8A to 8K are timing charts showing the operation of the timing setting circuit 101 of this embodiment according to the present invention. A signal SVTE indicative of a fuse breakdown sequence is supplied to the timing setting circuit 101. When the timing signal CLK is given to the shifter 12-0, the output SH0 of the shifter 12-0 is activated (ta). The output SH0 is outputted to the shifter 12-1 at the next stage and also supplied to the AND circuit 14-0. At that time, since the shifter 12-1 at the next stage is not active, the output of the inverter 13-0 is active. Since the timing signal CLK is also active, the output A0 of the AND circuit 14-0 is activated (tb). When the timing signal CLK becomes inactive (at the Low level), the output A0 of the AND circuit 14-0 becomes inactive (tc).

Next, when the timing signal CLK is activated, since the output SH0 of the shifter 12-0 is active, the output SH1 of the shifter 12-1 is activated (td). The output SH1 is outputted to the shifter 12-2 at the next stage and also supplied to the AND circuit 14-1. Since the output SH1 of the shifter 12-1 is activated, the signal inverted by the inverter 13-0 is supplied to the AND circuit 14-0. While the output SH1 is active, the output A0 of the AND circuit 14-0 is not activated. At that time, since the shifter 12-2 at the next stage is not active, the output of the inverter 13-1 is active. Since the timing signal CLK is also active, the output A1 of the AND circuit 14-1 is activated (te). When the timing signal CLK becomes inactive (at the Low level), the output A1 of the AND circuit 14-1 becomes inactive (tf).

In this way, the timing setting circuit 101 sequentially outputs the breakdown timing signals A0 to An. When the output SHn of the shifter 12-n at the final stage is activated (tg), the output An of the AND circuit 14-n is activated (th). When the timing signal CLK becomes inactive, the output An becomes also inactive (ti). Even if the timing signal CLK is activated next, the output SH(n+1) of the shifter 15 is activated. Thus, the output An is not activated (tj).

As mentioned above, the timing setting circuit 101 responds to the timing signal CLK, and sequentially activates the breakdown timing signals A0 to An indicative of the timings that the anti-fuses 100 are broken down. Then, the timing setting circuit 101 gives the breakdown timing signals A0 to An to the corresponding one of the redundancy fuse circuits 102-0 to 120-n.

The method of the fuse breakdown sequence in this embodiment, which performs the dielectric breakdown on the anti-fuses 100 one by one, will be described with reference to FIGS. 9A to 9K.

FIGS. 9A to 9K are timing charts showing the operation of the fuse breakdown sequence performed by the fuse breakdown setting circuit 105 and the voltage applying circuit 106 of this embodiment according to the present invention. The signal SVTE indicative of the fuse breakdown sequence is activated. The defect address is supplied as the address signal XAD. The timing of the address input is determined by the command decoder common circuit 208. Here, it is assumed to be supplied after the start of the fuse breakdown sequence.

The breakdown timing signals A0 to An outputted by the timing setting circuit 101 are sequentially activated in response to the timing signal CLK. The address signal XAD activates the breakdown setting signals VC corresponding to the bits that are at the High level (here, the breakdown setting signals VC0 and VC2 corresponding to EN and X2 are activated), and the other breakdown setting signals VC are not activated even at that timing (the dashed lines). Thus, the anti-fuses 100 corresponding to the breakdown setting signals VC, VC2 are dielectrically broken down, one by one.

The initializing operation in this embodiment will be described with reference to FIGS. 10A to 10F.

FIGS. 10A to 10F are timing charts showing the initializing operation of this embodiment according to the present invention. The breakdown control circuit 107 and the fuse latch circuit 108 sample and hold the breakdown/non-breakdown state of the anti-fuse 100. In the sampling operation, firstly, a potential is supplied to the contact B of the anti-fuse 100. After that, That is, the potential of the contact B is varied based on the breakdown/non-breakdown of the anti-fuse 100. Then, when the potential becomes at the level that the variation in the potential can be judged, the judging result is held by the latch circuit 49.

The timing of the sampling is, for example, the fuse initialization sequence immediately after the power source is supplied to the semiconductor device. Since the breakdown setting signal VC is inactive, the n-channel transistor 32 of the voltage applying circuit 106 is ON. Thus, the potential of the contact C of the anti-fuse 100 is controlled by the n-channel transistor 33. The n-channel transistor 33 is controlled by an inversion signal PREB1 of the preparation signal PRE.

When the preparation signal PRE becomes at the High level (t1), the signals PREB1, PREB2 become at the Low level, the n-channel transistors 33, 34 become OFF, and the p-channel transistor 23 becomes ON. The contact B is charged to the standard voltage VH through the p-channel transistor 23 (t4). After the anti-fuse 100 is sufficiently charged, when the preparation signal PRE becomes at the Low level (t2), the signal PREB1 becomes at the High level, which turns OFF the p-channel transistor 23, and turns ON the n-channel transistor 33, and also makes the contact C at the ground level. At this time, the n-channel transistor 34 continues to be OFF for the time delayed by the delaying circuit 47 and has no influence on the potential of the contact B.

If the anti-fuse 100 is not dielectrically broken down (the solid line), the anti-fuse 100 functions as a condenser so that the potential of the contact B is maintained for a while. If the anti-fuse 100 is dielectrically broken down (the dashed line), the anti-fuse 100 functions as a conductor having a certain resistance. Then, since the anti-fuse 100 discharges charges through the contact C, the n-channel transistor 32 and the n-channel transistor 33, the potential of the contact B is dropped. When the discharge is advanced, the sampling signal SE is made at the High level (t3). When the sampling signal SE becomes at the High level, the n-channel transistor 39 becomes ON, and the p-channel transistors 24, 25 become OFF. Then, the sense amplifier 48 begins to operate.

The potential of the contact B of the anti-fuse 100 charged to the standard potential VH is given to one input of the sense amplifier 48, and the standard potential VH– slightly lower than the standard potential VH is given to another input. The differential potential between the potential VH and the potential VH– is the potential that can be detected by the sense amplifier 48, and it may be 0.1 to 0.2 V. As shown in FIGS. 10A to 10F, if the anti-fuse 100 is dielectrically broken down and the potential of the contact B is at the ground level, the potential of the contact B is lower than the potential VH–, the High level is supplied to a NAND circuit 45, and the Low level is supplied to a NAND circuit 46. On the contrary, if the anti-fuse 100 is not dielectrically broken down and the potential of the contact B is the VH, the potential of the contact B is higher than the potential VH–, the Low level is supplied to the NAND circuit 45, and the High level is supplied to the NAND circuit 46. That is, depending on the state of the anti-fuse 100, the value of the differential potential detected by the sense amplifier 48 is inverted from one of positive and negative to another. Consequently, the sense amplifier 48 can judge whether or not the anti-fuse 100 is broken down.

The latch circuit 49 holds the output of the sense amplifier 48 and outputs the judgment result signal REDE inverted by the inverter 43. Thus, if the sense amplifier 48 judges that the anti-fuse 100 is broken down, the judgment result signal REDE becomes at the High level. On the contrary, if the sense amplifier 48 judges that the anti-fuse 100 is not broken down, the judgment result signal REDE becomes at the Low level.

As mentioned above, in this embodiment, the plurality of anti-fuses are broken down, one by one, in the fuse breakdown sequence. Also, in the fuse initialization sequence, the state of the breakdown/non-breakdown of the anti-fuse is set for the latch circuit. If the access to the defect address is done in the redundancy selection sequence, the redundancy selection is done so as not to select the defective memory cell.

The operation of a first variation of the first embodiment will be described with reference to FIGS. 11A to 11K.

FIGS. 11A to 11K are timing charts showing a first variation of the first embodiment according to the present invention. In this variation, the configuration of the timing setting circuit 101 is the same as that shown in FIG. 3. The shifters 12-0 to 12-*n* and 15 count the number of the pulses of the clocks (timing signals CLK) in the shifting operation for synchronizing the respective input signals (SVTE, SH0 to SH*n*) with the clock and outputting the synchronized respective input signals (SH0 to SH*n*+1). In the shifting operation of the above-mentioned first embodiment, the synchronized input signal is outputted at one clock. In this variation, the shifter is designed so as to output the synchronized input signal at two clocks or more. This enables the timing circuit 11 to generate pulses to program the anti-fuse 100 of which number corresponds to the number of the clocks. By applying a plurality of the high voltages to one anti-fuse 100, the anti-fuse 100 is surely dielectrically broken down. FIGS. 11A to 11K show the case that each shifter outputs the synchronized input signal (SH0 to SH*n*+1) at the two clocks.

The signal SVTE is supplied to the timing setting circuit 101. When the second pulse of the timing signal CLK is supplied to the shifter 12-0, the output SH0 of the shifter 12-0 is activated (ta). The shifter 12-0 outputs the output SH0 to the shifter 12-1 and the AND circuit 14-0. At that time, since the shifter 12-1 is not active and the output SH1 is inactive, the output of the inverter 13-0 is active. While the timing signal CLK is active, the output A0 of the AND circuit 14-0 is active (tb). When the third pulse of the timing signal CLK is supplied, the shifter 12-1 is at the same state of the first clock, in which the output SH1 is inactive. Thus, while the timing signal CLK is active, the output A0 is active (tc) similarly to the time of the second pulse input. When the fourth pulse of the timing signal CLK is supplied, the shifter 12-1 activates the output SH1 (td) and activates the output A1 (te) while the timing signal CLK is active. Since the output SH1 of the shifter 12-1 is activated, the output A0 is not activated.

Similarly, when the fifth pulse of the timing signal CLK is supplied, the output A1 is activated (tf). This operation is sequentially repeated until the shifter 12-*n*. Then, the output SH*n* of the shifter 12-*n* is activated, and the output A*n* is activated in response to the activation of the timing signal CLK (th, ti). When the (2n+3)-th pulse of the timing signal CLK is supplied, the output SH(n+1) of the shifter 15 is activated, which suppresses the AND circuit 14-*n* at the former stage. Thus, the output A*n* after that is not activated (tj).

As mentioned above, the timing setting circuit 101 in the first variation of the first embodiment sequentially generates the plurality of pulses as each of the breakdown timing signals A0 to A*n* in response to the timing signal CLK, and gives them to corresponding one of the redundancy fuse circuits 102-0 to 102-*n*. On the basis of the signals given to the redundancy fuse circuits 102-0 to 102-n, the plurality of high voltages SVT to program are applied to each of the anti-fuses 100, thereby enabling the sure programming of the anti-fuses 100.

The Second Embodiment

A second embodiment will be described below with reference to FIGS. 12 to 14. In this embodiment, the same symbols are given to the same components (elements) as the first embodiment, and their detailed description is omitted.

Immediately after a certain anti-fuse 100 (here, assumed to be an anti-fuse 100-0) is dielectrically broken down, there may be a case that the potential level of the high voltage SVT is dropped. If the high voltage SVT is supplied to the next anti-fuse 100 (here, assumed to be an anti-fuse 100-1) to perform the dielectric breakdown even though the of the potential level is still down, it is difficult to dielectrically break down the anti-fuse 100-1. Therefore, the second embodiment is designed such that after the certain anti-fuse 100 is dielectrically broken down, until the high voltage SVT whose level exceeds (recovers) a standard level, the high voltage SVT is not applied to the anti-fuse 100 to be dielectrically broken down.

Figure 12:
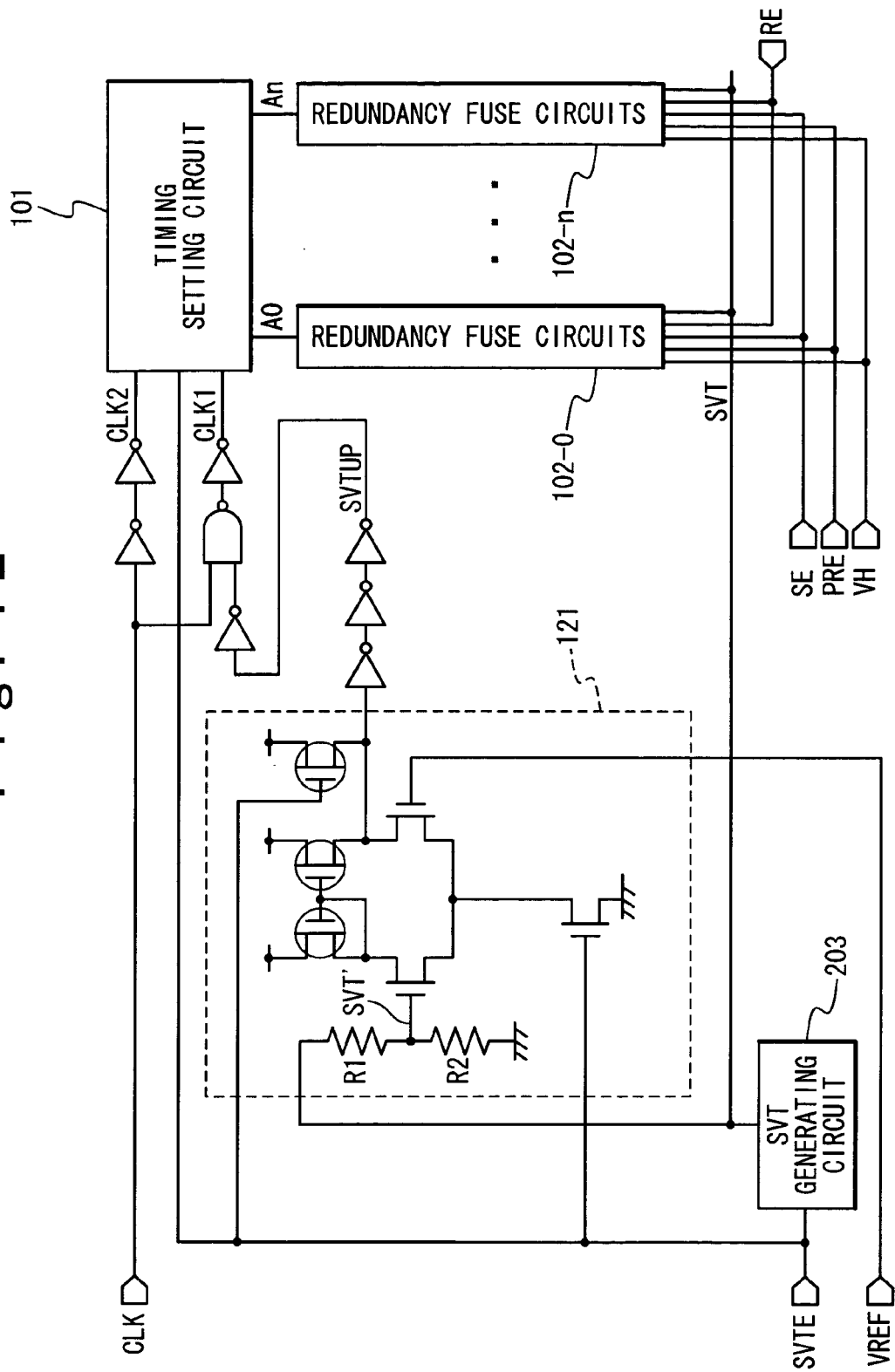
FIG. 12 is a view showing the configuration of a level detecting circuit and the related circuits of the second embodiment.

FIG. 12 is a view showing the configuration of a level detecting circuit and the relation among other circuits. As shown in FIG. 12, the high voltage SVT is divided by resistors R1, R2 of the level detecting circuit 121. The divided potential is compared with a standard potential VREF. If the divided potential (referred to as SVT') exceeds the standard potential VREF (an SVT standard level of FIG. 14D), a signal SVTUP becomes at the Low level (refer to FIG. 14E). The period of the Low level is the period when the high voltage SVT can be applied to the anti-fuse 100. On the basis of a timing signal CLK1 and a timing signal CLK2, the high voltage SVT is applied to the anti-fuse 100. Here, the timing signal CLK1 is a signal of a logical product between the inversion signal of the signal SVTUP and the timing signal CLK. The timing signal CLK2 is synchronized with the timing signal CLK.

Figure 13:
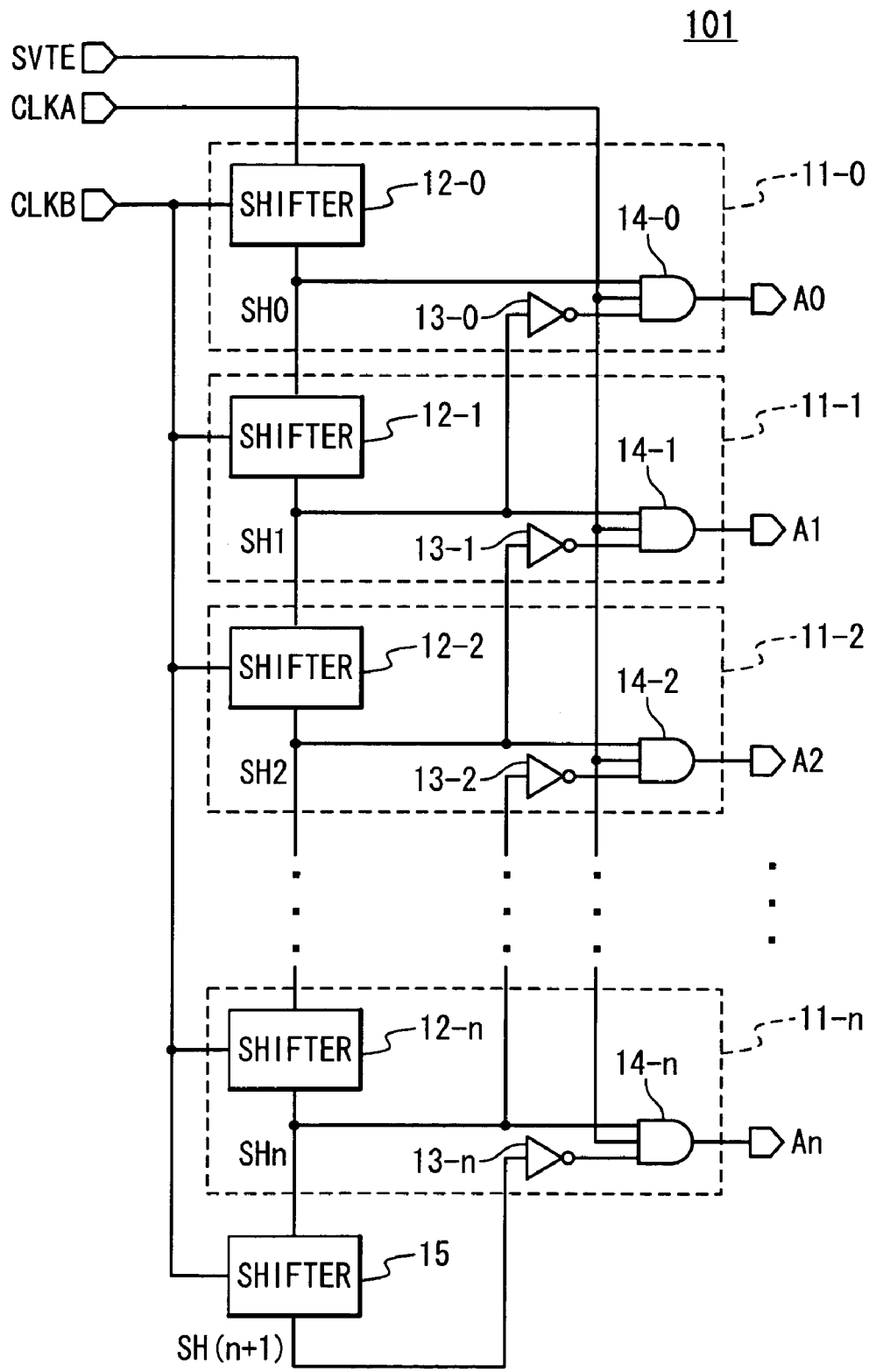
FIG. 13 is a block diagram showing the configuration of the timing setting circuit of the second embodiment.
Figure 14:
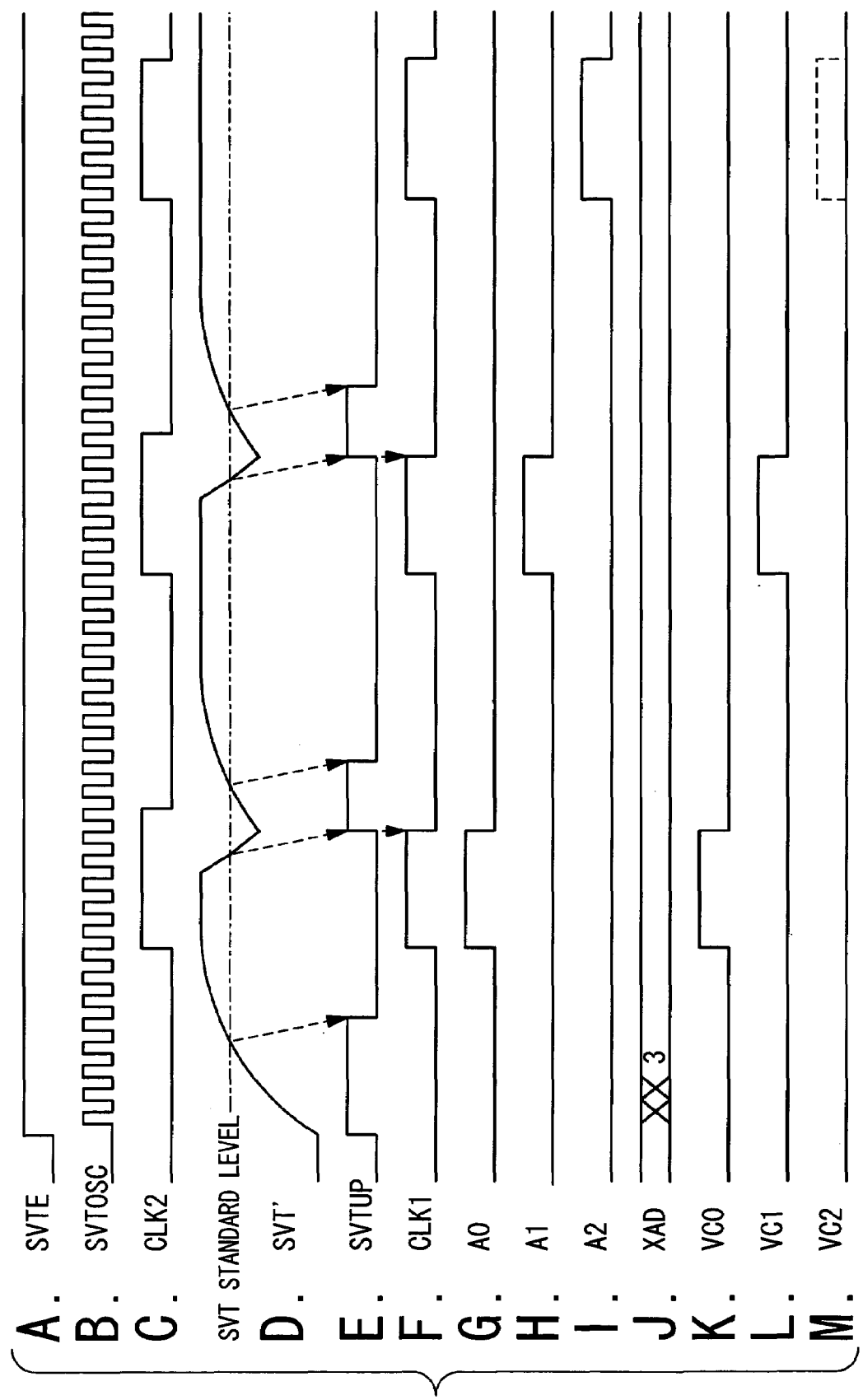
FIGS. 14A to 14M are timing charts showing the operation of the setting circuit of the second embodiment.
Figure 15:
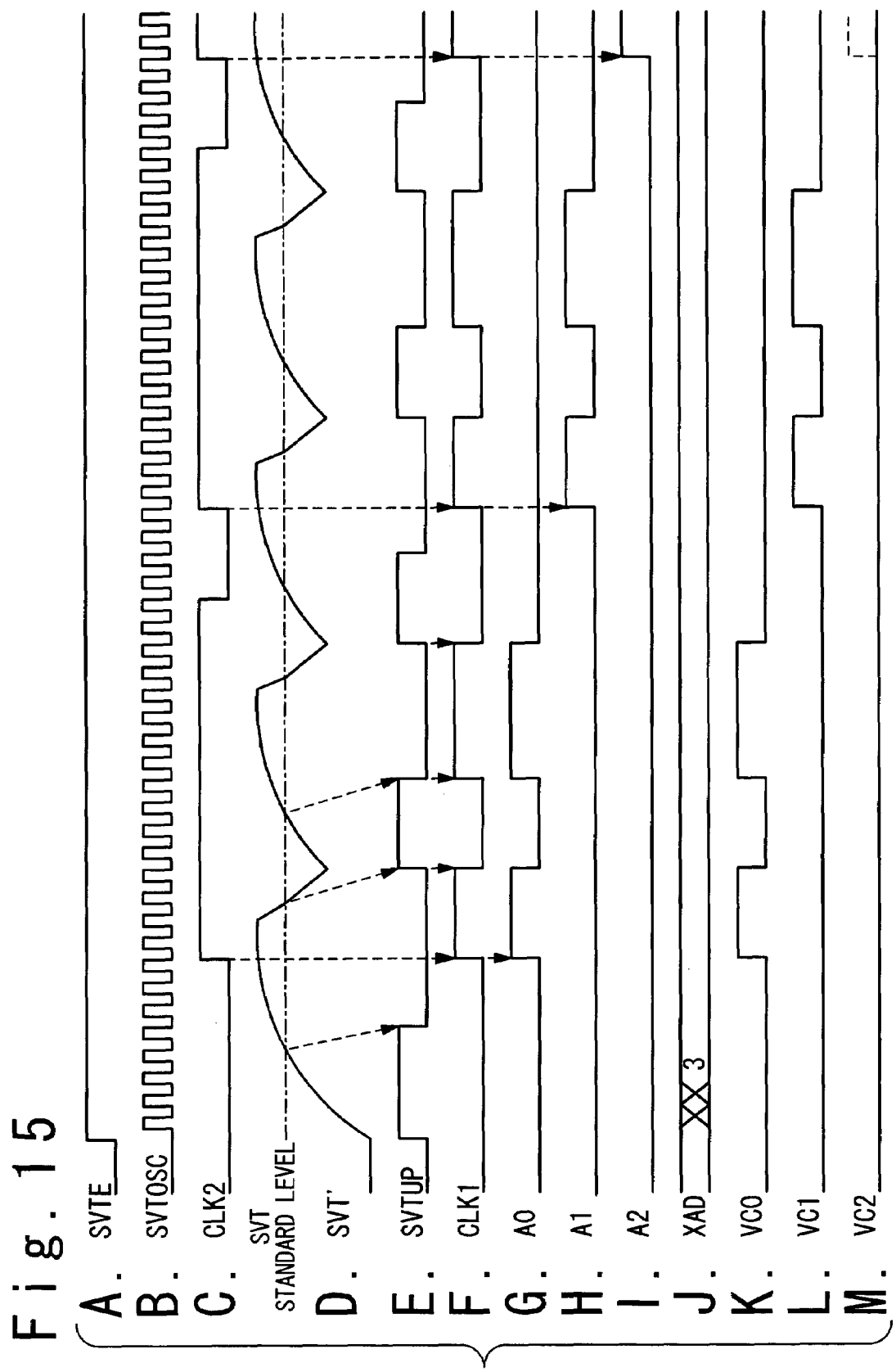
FIGS. 15A to 15M are timing charts of a first variation of the second embodiment.
Figure 16:
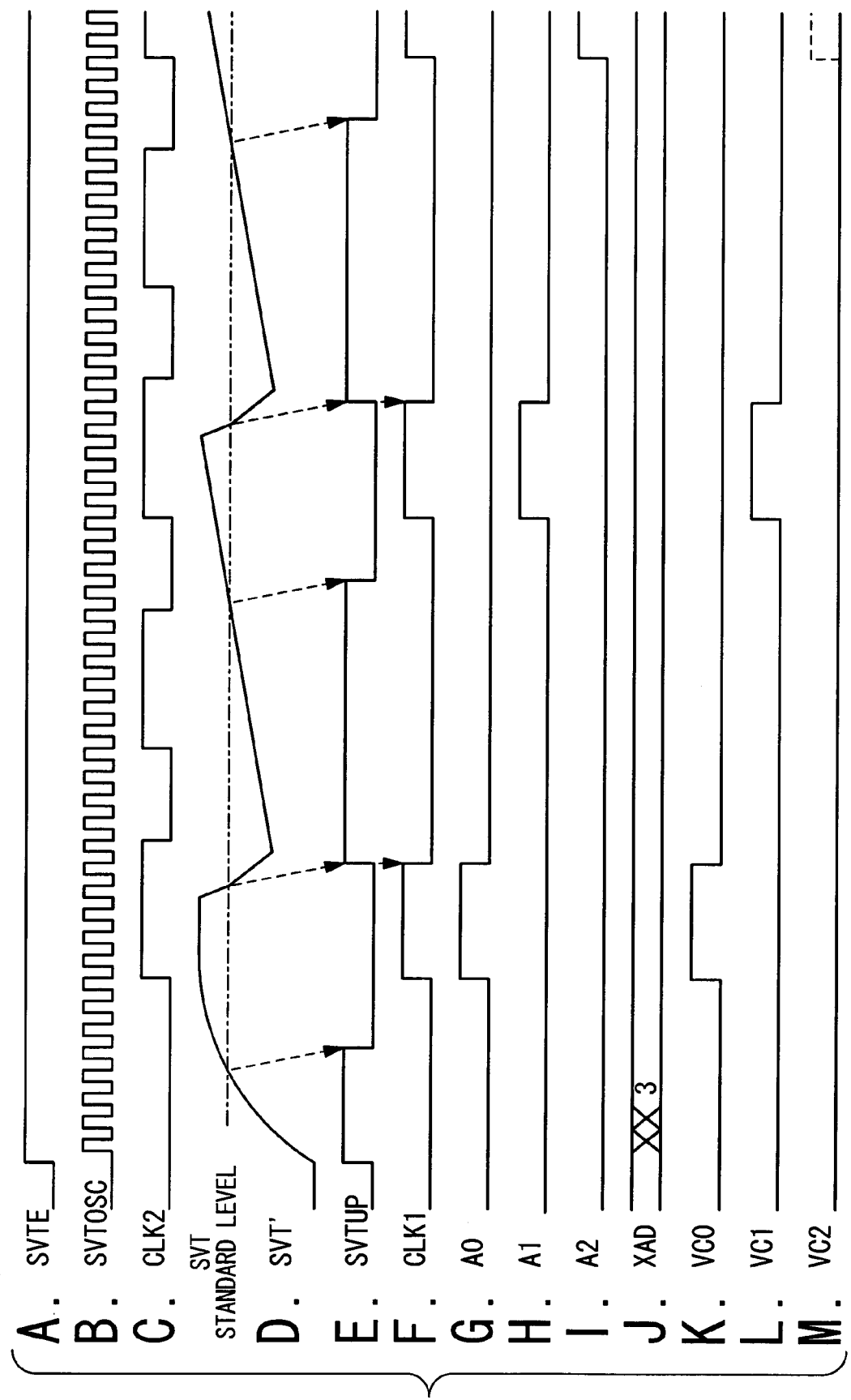
FIGS. 16A to 16M are timing charts of a second variation in the second embodiment.

FIG. 13 is a block diagram showing the configuration of the timing setting circuit 101 of this embodiment. As shown in FIG. 13, the timing setting circuit 101 is configured so as to separate a timing signal CLKA and a timing signal CLKB. The timing signal CLKA is the timing signal supplied to the AND circuits 14. The timing signal CLKB is the timing signal supplied to the shifters 12, 15.

FIGS. 14A to 14M are timing charts showing the operation of the timing setting circuit 101 of this embodiment.

When the timing signal CLK2 is supplied as the timing signal CLKA and the timing signal CLK1 is supplied as the timing signal CLKB to the timing setting circuit 101, the timing signal CLK1 is supplied to the shifters 12, 15. Thus, the outputs SH00, SH01, SH02 . . . are sequentially activated in response to the input timings of the timing signal CLK1. Since the timing signal CLK2 is supplied to the AND circuit 14, the breakdown timing signals A0, A1 . . . are outputted at the input timings of the timing signal CLK2. Consequently, until the division potential SVT' exceeds the standard potential VREF, the high voltage SVT is never applied to the anti-fuse 100. The anti-fuse 100 can be surely broken down. Also, if the high voltage SVT is not applied to the anti-fuse 100, the potential drop in the high voltage SVT is never induced.

If the timing signal CLK is given in a period in which the high voltage SVT is sufficiently recovered, as shown in FIGS. 14A to 14M, the high voltage SVT is applied to the anti-fuse 100 once at a pulse.

FIGS. 15A to 15M are timing charts of a first variation of the second embodiment. In the first variation, similarly to the second embodiment, the timing signal CLK2 is supplied to the CLKA of the timing setting circuit 101, and the timing signal CLK1 is supplied to the CLKB. As shown in FIGS. 15A to 15M, if the period until the potential SVT' exceeds the standard potential VREF (SVT standard level) after the breakdown of the anti-fuse is short and below the half of the active period of the timing signal CLK, when the potential SVT' exceeds the standard potential VREF, the timing signal CLK1 is activated, and the high voltage SVT is immediately applied to the anti-fuse 100. By applying the high voltage a plurality of times to the same anti-fuse within the same clock, further surely, the anti-fuse can be dielectrically broken down.

FIGS. 16A to 16M are timing charts of a second variation in the second embodiment. The second variation is designed such that the timing signal CLK1 is supplied to the CLKA and CLKB of the timing setting circuit 101. As shown in FIGS. 16A to 16M, if the period until the potential SVT' exceeds the standard potential VREF after the dielectric breakdown is longer than the cycle of the timing signal CLK, the potential SVT is applied to the next anti-fuse 100 in synchronization with the timing signal CLK1. If the period until the potential SVT' exceeds the standard potential VREF is longer than the cycle of the timing signal CLK, when the shifter 12 is advanced on the basis of the timing signal CLK2, the high voltage SVT when the potential SVT' is less than the standard potential VREF is applied to the anti-fuse 100. Therefore, there may be a case that the dielectric breakdown is not performed. Thus, the shifter is advanced on the basis of the timing signal CLK1.

The above-mentioned first and second embodiments are designed such that the high voltage SVT is applied to each anti-fuse 100. However, in the present invention, it is not limited to one. For example, the high voltage SVT can be applied to each two (or three or more) anti-fuses 20, at the same time.

The Third Embodiment

Figure 17:
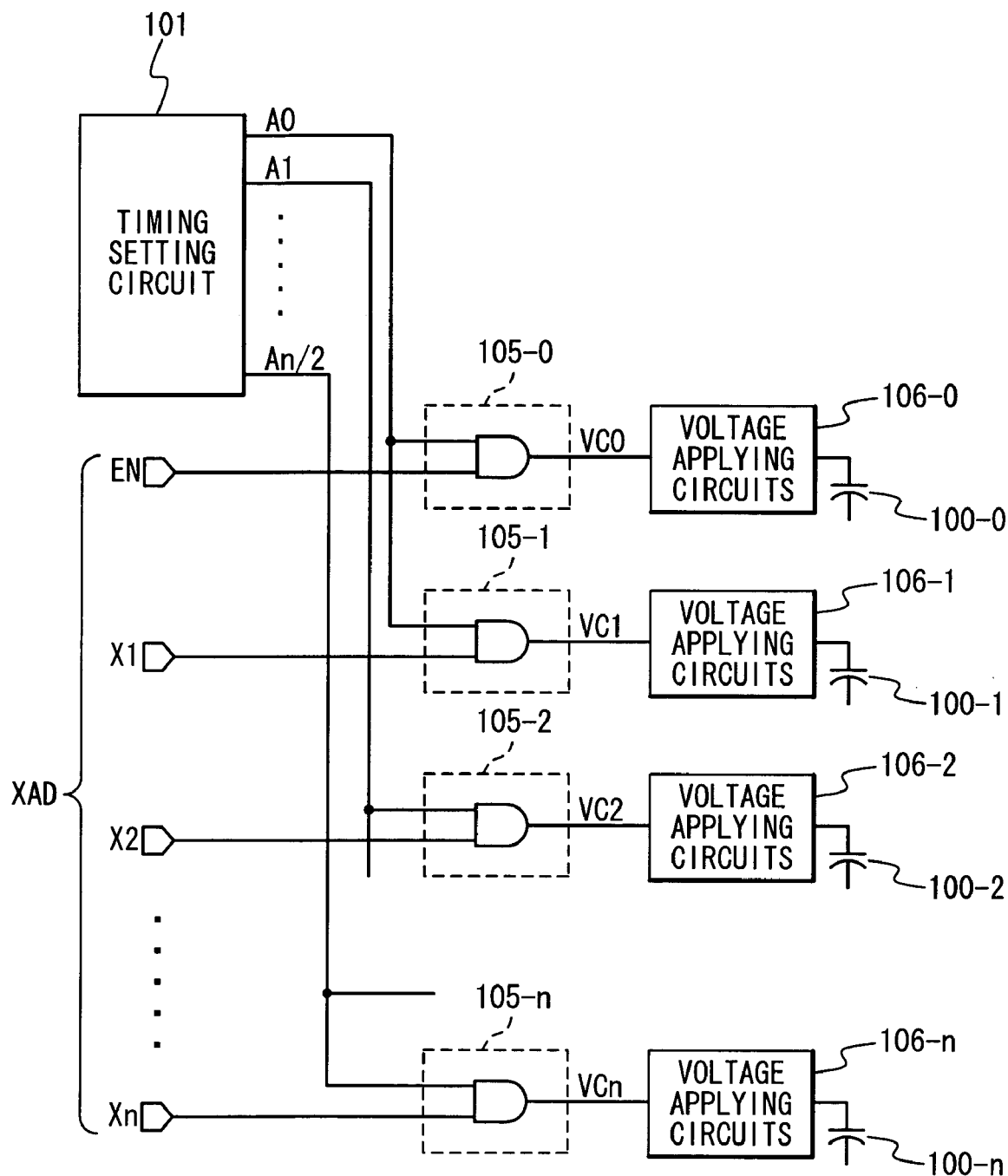
FIG. 17 is a block diagram showing the configuration of the fuse breakdown setting circuit and the related circuit of the third embodiment.

The configuration of the fuse breakdown setting circuit 105 and the relation among the fuse breakdown setting circuit 105 and other circuits will be described with reference to FIG. 17. FIG. 17 is a block diagram showing the configuration of the fuse breakdown setting circuit 105 and the relation among the fuse breakdown setting circuit 105 and other circuits in a third embodiment. By supplying the output of the timing setting circuit 101 to the two fuse breakdown setting circuits 105, it is possible to simultaneously program two anti-fuses 100. In this case, it is necessary that the SVT generating circuit 203 has the current capacity enough to program the two anti-fuses 100. This has the merit that the simultaneous programming can greatly reduce the time necessary for the programming. In FIG. 17, the output from the timing setting circuit 101 is supplied to the two fuse breakdown setting circuits 105. However, by supplying to the m fuse breakdown setting circuits 105, it is possible to program the m anti-fuses.

Conventionally, the high voltage SVT is simultaneously applied to all of the plurality of anti-fuses 100 to be electrically broken down correspondingly to the defect address. For this reason, the possibility of the occurrence of the phenomenon that the anti-fuse 100, which is dielectrically broken down prior to the other fuses, becomes the current leak source. This leads to the drop in the level of the voltage applied to the other anti-fuses 100 (the possibility that only one fuse may become the current leak source due to the dielectric breakdown prior to the other fuses).

On the contrary, in the present invention, the high voltage SVT is simultaneously applied to the anti-fuse 100 whose number (including 1) is less than the number of the anti-fuses 100 to be broken down correspondingly to the defect address. Thus, the possibility of the occurrence of the current leak source is relatively lower than that of the conventional technique, and the anti-fuse 100 can be further surely broken down.

The above-mentioned descriptions have been described by using the anti-fuse as the program element. When the metal fuse is employed as the program element, if the voltage is applied to the metal fuse to then program, the metal fuse becomes non-conductive and has the polarity opposite to the anti-fuse. Thus, if the voltage to break down the plurality of metal fuses is applied, current separately flows into the respective metal fuses. Hence, the current supplying performance of the SVT generating circuit is lacked, which drops the voltage. Even in this case, it is obvious that this application can be applied.

According to the redundancy control circuit in the present invention, by programming the program element a plurality of times in synchronization with the external signal, it is possible to further surely program the program element.

According to the redundancy control circuit in the present invention, it is possible to continue to apply the high voltage to program until the dielectric breakdown of the targeted anti-fuse. Thus, even if the current capacity of the high voltage generating circuit to program is limited, it is possible to surely perform the dielectric breakdown on the anti-fuse.

What is claimed is:

1. A redundancy control circuit comprising:
   a plurality of program elements, in which a defect address indicating a position of a defect is programmed by a dielectric breakdown due to applying of a voltage; and
   a voltage control section which applies said voltage to part of a plurality of targeted program elements simultaneously,
   wherein said plurality of targeted program elements is part of said plurality of program elements to be dielectrically broken down correspondingly to said defect address, and
   wherein said voltage control section includes a timing setting section which outputs a timing signal indicating a timing for carrying out a dielectric breakdown of each of said plurality of program elements based on a trigger signal.

2. The redundancy control circuit according to claim 1, wherein;
   a number of said part of the plurality of targeted program elements, of which number is less than a number of said plurality of program elements, is one, and
   said voltage control section applies said voltage to each of said plurality of targeted program elements, one by one.

3. The redundancy control circuit according to claim 1, wherein said voltage control section applies said voltage to said plurality of targeted program elements, at a timing of a trigger signal.

4. The redundancy control circuit according to claim 1, wherein said voltage control section commonly applies said voltage to said plurality of targeted program elements, and said voltage is a voltage generated inside a device including said redundancy control circuit.

5. The redundancy control circuit according to claim 1, wherein said voltage control section further includes:
   a plurality of element breakdown sections, each of which is installed correspondingly to said each of the plurality of program elements and applies said voltage to corresponding one of said plurality of program elements based on said timing signal and said defect address.

6. The redundancy control circuit according to claim 5, wherein each of said plurality of element breakdown sections includes:
   a fuse breakdown setting section which applies a specifying signal at a timing of said timing signal based on said defect address, wherein said specifying signal indicates whether or not said corresponding one of the plurality of program elements should be dielectrically broken down, and
   a voltage applying section which applies said voltage to said corresponding one of the plurality of program elements in responses to said specifying signal, when said specifying signal indicates that said corresponding one of the plurality of program elements should be dielectrically broken down.

7. The redundancy control circuit according to claim 6, wherein a first timing is different from a second timing,
   said first timing is a timing when a first said fuse breakdown setting section for a first one of said plurality of program elements, outputs a first said specifying signal, and
   said second timing is a timing when a second said fuse breakdown setting section for a second one of said plurality of program elements, outputs a second said specifying signal.

8. The redundancy control circuit according to claim 7, further comprising:
   a comparing section which compares said voltage with a standard voltage and outputs a comparing result signal,
   wherein said timing setting section generates said second timing based on said trigger signal and said comparing result signal indicating that said voltage exceeds said standard voltage, after said voltage applying section supplies said voltage in response to said first specifying signal supplied at said first timing.

9. The redundancy control circuit according to claim 8, wherein said timing setting section includes:
   a first counter, which starts counting a first pulse number of said trigger signal when said first pulse number is N, and outputs a first control signal when counted said first pulse number is N,
   a second counter, which starts counting a second pulse number of said trigger signal when said second pulse number is (M+N), and outputs a second control signal when counted said second pulse number is N, and
   a third counter, which starts counting a third pulse number of said trigger signal when said third pulse number is (M+2×N), and outputs a third control signal when counted said third pulse number is N,
   said first counter includes a first logical section which outputs a first said timing signal timing when said first specifying signal is outputted, based on an inversion signal of said second control signal and said first control signal, and
   said second counter includes a second logical section which outputs a second timing signal indicative of a timing when said second specifying signal is outputted, based on an inversion signal of said third control signal and said second control signal.

10. The redundancy control circuit according to claim 1, wherein said program element is an anti-fuse.

11. A semiconductor memory, comprising:
a redundancy control circuit which includes:
a plurality of program elements, in which a defect address indicating a position of a defect is programmed by a dielectric breakdown due to applying of a voltage, and
a voltage control section which applies said voltage to part of a plurality of targeted program elements simultaneously, wherein said plurality of targeted program elements is part of said plurality of program elements to be dielectrically broken down correspondingly to said defect address;
one of a redundancy word line and a redundancy bit line which is replaced from one of a defective word line and a defective bit line corresponding to said defect address; and
a plurality of redundancy memory cells which is connected to one of said redundancy word line and said redundancy bit line;
wherein said voltage control section includes a timing setting section which outputs a timing signal indicating a timing for carrying out a dielectric breakdown of each of said plurality of program elements based on a trigger signal.

12. The semiconductor memory according to claim 11, wherein a number of said part of the plurality of targeted program elements, of which number is less than a number of said plurality of program elements, is one, and
said voltage control section applies said voltage to each of said plurality of targeted program elements, one by one.

13. The semiconductor memory according to claim 11, wherein said voltage control section applies said voltage to said plurality of targeted program elements, at a timing of a trigger signal.

14. The semiconductor memory according to claim 11, wherein;
said voltage control section commonly applies said voltage to said plurality of targeted program elements, and
said voltage is a voltage generated inside a device including said redundancy control circuit.

15. The semiconductor memory according to claim 11, wherein said voltage control section further includes:
a plurality of element breakdown sections, each of which is installed correspondingly to said each of the plurality of program elements and applies said voltage to corresponding one of said plurality of program elements based on said timing signal and said defect address.

16. The semiconductor memory according to claim 15, wherein each of said plurality of element breakdown sections includes:
a fuse breakdown setting section which applies a specifying signal at a timing of said timing signal based on said defect address, wherein said specifying signal indicates whether or not said corresponding one of the plurality of program elements should be dielectrically broken down, and
a voltage applying section which applies said voltage to said corresponding one of the plurality of program elements in response to said specifying signal, when said specifying signal indicates that said corresponding one of the plurality of program elements should be dielectrically broken down.

17. The semiconductor memory according to claim 16, wherein a first timing is different from a second timing,
said first timing is a timing when a first said fuse breakdown setting section for a first one of said plurality of program elements, outputs a first said specifying signal, and
said second timing is a timing when a second said fuse breakdown setting section for a second one of said plurality of program elements, outputs a second said specifying signal.

18. The semiconductor memory according to claim 17, further comprising:
a comparing section which compares said voltage with a standard voltage and outputs a comparing result signal,
wherein said timing setting section generates said second timing based on said trigger signal and said comparing result signal indicating that said voltage exceeds said standard voltage, after said voltage applying section supplies said voltage in response to said first specifying signal supplied at said first timing.

19. The semiconductor memory according to claim 18, wherein said timing setting section includes:
a first counter, which starts counting a first pulse number of said trigger signal when said first pulse number is M, and outputs a first control signal when counted said first pulse number is N,
a second counter, which starts counting a second pulse number of said trigger signal when said second pulse number is (M+N), and outputs a second control signal when counted said second pulse number is N, and
a third counter, which starts counting a third pulse number of said trigger signal when said third pulse number is (M+2×N), and outputs a third control signal when counted said third pulse number is N,
said first counter includes a first logical section which outputs a first said timing signal indicative of a timing when said first specifying signal is outputted, based on an inversion signal of said second control and said first control signal, and
said second counter includes a second logical section which outputs a second timing signal indicative of a timing when said second specifying signal is outputted, based on an inversion signal of said third control signal and said second control signal.

20. The semiconductor memory according to claim 11, wherein said program element is an anti-fuse.

21. The semiconductor memory according to claim 11, wherein:
said semiconductor memory is DRAM, and
said plurality of program elements includes the same structure as a capacitor of a memory cell of said DRAM.

* * * * *